(12) United States Patent
Bok

(10) Patent No.: US 11,782,545 B2
(45) Date of Patent: Oct. 10, 2023

(54) FOLDABLE DISPLAY DEVICE

(71) Applicant: Samsung Display Co., Ltd., Yongin-si (KR)

(72) Inventor: Seung-Iyong Bok, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/857,143

(22) Filed: Jul. 4, 2022

(65) Prior Publication Data

US 2022/0350433 A1     Nov. 3, 2022

Related U.S. Application Data

(63) Continuation of application No. 17/012,885, filed on Sep. 4, 2020, now Pat. No. 11,379,064, which is a (Continued)

(30) Foreign Application Priority Data

Sep. 8, 2016    (KR) ........................ 10-2016-0115864

(51) Int. Cl.
    *G06F 3/041*      (2006.01)
    *H10K 77/10*      (2023.01)
    (Continued)

(52) U.S. Cl.
    CPC ............ *G06F 3/0412* (2013.01); *G06F 3/044* (2013.01); *G06F 3/0446* (2019.05); (Continued)

(58) Field of Classification Search
    CPC ............... H01L 27/323; H01L 27/3244; H01L 51/0097; H01L 51/5212; H01L 51/5218; (Continued)

(56) References Cited

U.S. PATENT DOCUMENTS 5,703,436 A    12/1997   Forrest et al.
7,679,093 B2    3/2010   Park et al.
(Continued)

FOREIGN PATENT DOCUMENTS

CN      105676965      6/2016
KR      10-0685844      2/2007
(Continued)

OTHER PUBLICATIONS

Notice of Allowance dated May 5, 2020, in U.S. Appl. No. 15/655,516.
(Continued)

*Primary Examiner* — Stephen G Sherman
(74) *Attorney, Agent, or Firm* — H.C. Park & Associates, PLC

(57) ABSTRACT

A display device including a flexible display module and provides a display surface on which an image is displayed. The flexible display module includes a display panel including a light-emitting device and a sensor unit disposed on the display panel. The sensor unit senses pressure applied to the flexible display module in a folded-in mode in which the flexible display module is folded such that a portion of the display surface faces another portion of the display surface.

14 Claims, 37 Drawing Sheets

Related U.S. Application Data continuation of application No. 15/655,516, filed on Jul. 20, 2017, now Pat. No. 10,770,517.

(51) Int. Cl.

| | | |
|---|---|---|
| *H10K 59/40* | (2023.01) | |
| *G06F 3/044* | (2006.01) | |
| *H10K 50/814* | (2023.01) | |
| *H10K 50/818* | (2023.01) | |
| *H10K 50/826* | (2023.01) | |
| *H10K 50/856* | (2023.01) | |
| *H10K 59/12* | (2023.01) | |
| *H10K 102/00* | (2023.01) | |

(52) U.S. Cl.
CPC ......... *G06F 3/0447* (2019.05); *H10K 50/814* (2023.02); *H10K 50/818* (2023.02); *H10K 50/826* (2023.02); *H10K 50/856* (2023.02); *H10K 59/40* (2023.02); *H10K 77/111* (2023.02); *G06F 2203/04102* (2013.01); *G06F 2203/04105* (2013.01); *H10K 59/12* (2023.02); *H10K 2102/3031* (2023.02); *H10K 2102/311* (2023.02)

(58) Field of Classification Search
CPC ............. H01L 51/5231; H01L 51/5271; H01L 2251/5323; H01L 2251/5338; G06F 3/044; G06F 2203/04102; G06F 2203/04105; H10K 59/40; H10K 59/12; H10K 50/814; H10K 50/826; H10K 50/818; H10K 50/856; H10K 77/111; H10K 2102/311; H10K 2102/3031
See application file for complete search history.

(56) References Cited

U.S. PATENT DOCUMENTS

| | | |
|---|---|---|
| 7,936,121 B2 | 5/2011 | Kim |
| 8,681,140 B2 | 3/2014 | Yamazaki et al. |
| 8,723,813 B2 | 5/2014 | Park et al. |
| 8,979,291 B2 | 3/2015 | Hack et al. |
| 9,024,907 B2 | 5/2015 | Bolender |
| 9,229,589 B2 | 1/2016 | Lee et al. |
| 9,304,348 B2 | 4/2016 | Jang |
| 9,419,065 B2 | 8/2016 | Degner et al. |
| 9,652,098 B2 | 5/2017 | Choi et al. |
| 9,733,757 B2 | 8/2017 | Chang et al. |
| 10,133,373 B2 | 11/2018 | Kim et al. |
| 10,268,294 B2 | 4/2019 | Seo et al. |
| 10,564,742 B2 | 2/2020 | Hwang et al. |
| 2005/0041009 A1 | 2/2005 | Kuroda |
| 2006/0197753 A1 | 9/2006 | Hotelling |
| 2012/0139834 A1 | 6/2012 | Han et al. |
| 2013/0193843 A1 | 8/2013 | Yan et al. |
| 2014/0131668 A1* | 5/2014 | Kim .................... H01L 51/5253 438/46 |
| 2014/0176421 A1 | 6/2014 | Chen |
| 2014/0339509 A1* | 11/2014 | Choi .................... H01L 51/5275 257/40 |
| 2015/0153862 A1* | 6/2015 | Nakamura ............ G06F 1/1626 345/173 |
| 2015/0352437 A1 | 12/2015 | Koseki et al. |
| 2015/0378465 A1 | 12/2015 | Shih et al. |
| 2016/0048262 A1 | 2/2016 | Chang et al. |
| 2016/0062498 A1 | 3/2016 | Huppi et al. |
| 2016/0109998 A1* | 4/2016 | Watanabe ............. G06F 3/0412 345/173 |
| 2016/0324023 A1* | 11/2016 | Kim ..................... G06F 1/1652 |
| 2017/0285837 A1 | 10/2017 | Zeng et al. |
| 2018/0004322 A1 | 1/2018 | Nakanishi |

FOREIGN PATENT DOCUMENTS

| | | |
|---|---|---|
| KR | 20140065867 A | 5/2014 |
| KR | 10-2014-0095279 | 8/2014 |
| KR | 10-2016-0000100 | 1/2016 |
| KR | 10-2016-0039765 | 4/2016 |
| KR | 20160046139 A | 4/2016 |
| KR | 10-2017-0047542 | 5/2017 |

OTHER PUBLICATIONS

Non-Final Office Action dated Jan. 14, 2020, in U.S. Appl. No. 15/655,516.
Final Office Action dated Aug. 23, 2019, in U.S. Appl. No. 15/655,516.
Non-Final Office Action dated May 3, 2019, in U.S. Appl. No. 15/655,516.
Final Office Action dated Nov. 21, 2018, in U.S. Appl. No. 15/655,516.
Non-Final Office Action dated Jul. 16, 2018, in U.S. Appl. No. 15/655,516.
Non-Final Office Action dated Aug. 23, 2021, in U.S. Appl. No. 17/012,885.
Final Office Action dated Dec. 10, 2021, in U.S. Appl. No. 17/012,885.
Notice of Allowance dated Mar. 3, 2022, in U.S. Appl. No. 17/012,885.

* cited by examiner

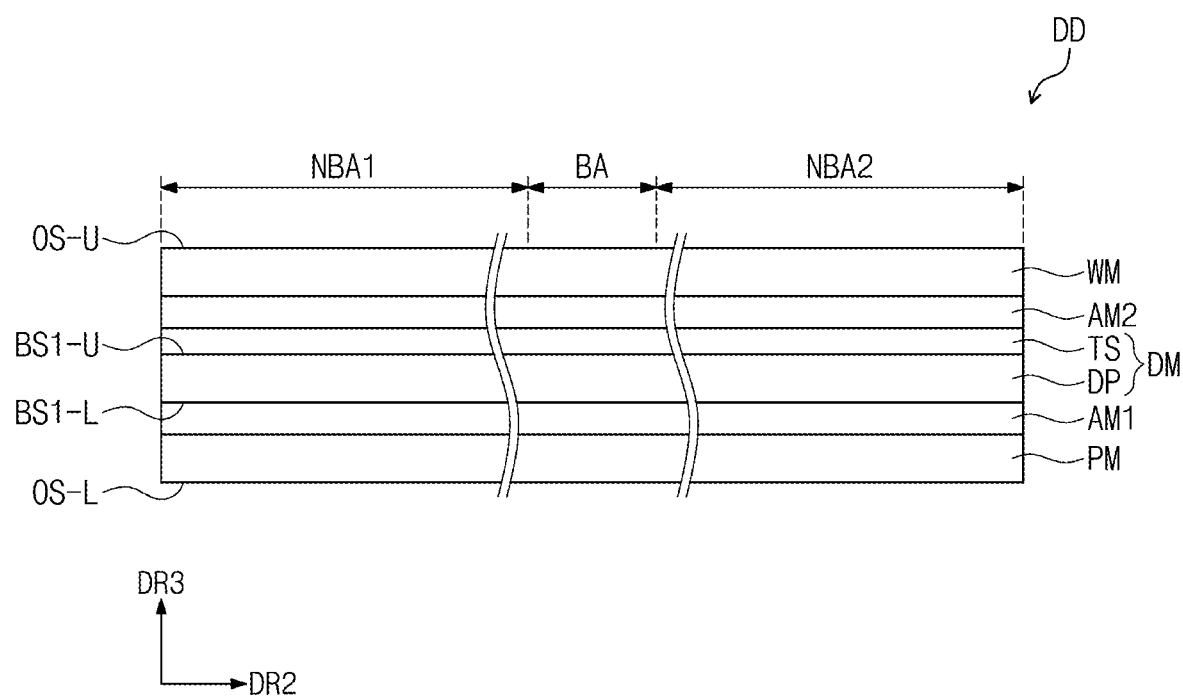

FIG. 15A
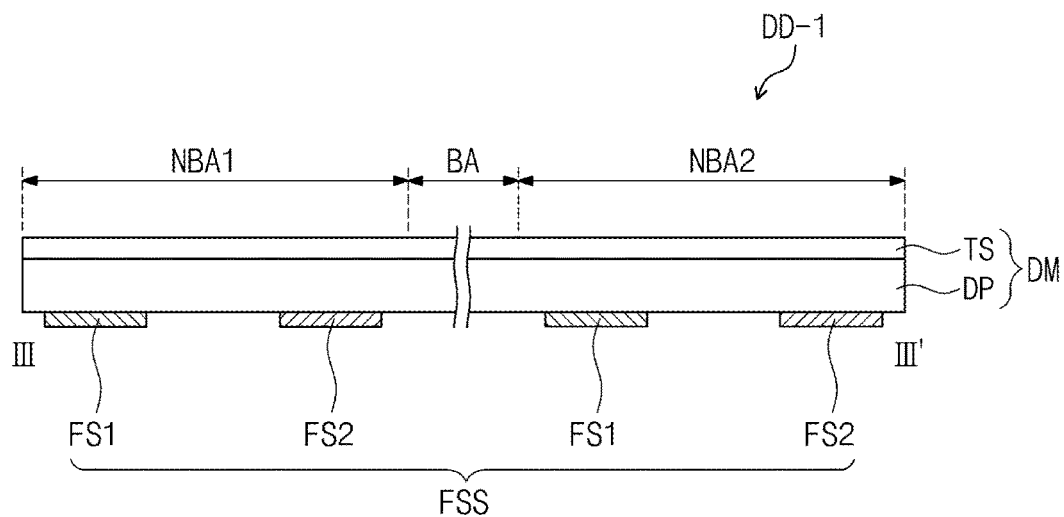
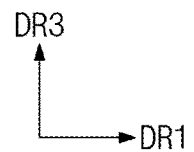
FIG. 15B
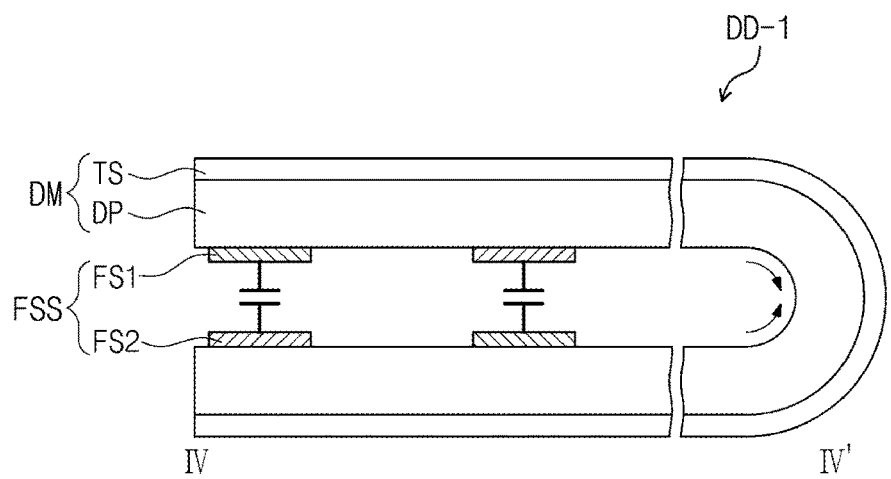
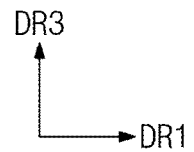

FOLDABLE DISPLAY DEVICE

CROSS-REFERENCE TO RELATED APPLICATION

This application is a Continuation of U.S. patent application Ser. No. 17/012,885, filed Sep. 4, 2020, which is a Continuation of U.S. patent application Ser. No. 15/655,616, filed Jul. 20, 2017, which issued as U.S. Pat. No. 10,770,517, and claims priority to and the benefit of Korean Patent Application No. 10-2016-0115864, filed Sep. 8, 2016, each of which is hereby incorporated by reference for all purposes as if fully set forth herein.

BACKGROUND

Field

Exemplary embodiments relate to a display device capable of sensing external pressure applied thereto.

Discussion of the Background

Various display devices have been developed to be used in multimedia devices such as televisions, portable phones, tablet computers, navigation systems, and game consoles. A keyboard or a mouse is used as an input device of the display device. In addition, the display devices may include touch sensor units used as input devices.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of sensing a touch of a user and an applied pressure.

Additional aspects will be set forth in the detailed description which follows, and, in part, will be apparent from the disclosure, or may be learned by practice of the inventive concept.

According to exemplary embodiments, a display device may include a flexible display module and may provide a display surface on which an image is displayed. The flexible display module may include a display panel including a light-emitting device and a sensor unit disposed on the display panel. The sensor unit may sense a first pressure applied to the flexible display module in a folded-in mode in which the flexible display module is folded such that a portion of the display surface faces another portion of the display surface.

In some embodiments, the sensor unit may include a plurality of first touch sensors transmitting an electric field and a plurality of second touch sensors receiving the electric field. At least one of the plurality of first touch sensors may overlap with at least one of the plurality of second touch sensors in the folded-in mode.

In some embodiments, the first pressure may be sensed by sensing a variation in capacitance between the at least one of the plurality of first touch sensors and the at least one of the plurality of second touch sensors in the folded-in mode.

In some embodiments, the sensor unit may include a plurality of first touch sensors and a plurality of second touch sensors capacitively coupled to the plurality of first touch sensors. At least one of the plurality of first touch sensors may overlap with at least another of the plurality of first touch sensors in the folded-in mode.

In some embodiments, the first pressure may be sensed by sensing a variation in capacitance between the at least one of the plurality of first touch sensors and the at least another of the plurality of first touch sensors in the folded-in mode.

In some embodiments, the display device may further include a force sensor disposed under the display panel, wherein the display device further comprises a back side which is opposite to the side of the display surface where the image is displayed, the flexible display module having a folded-outward mode in which the flexible display module is folded such that a portion of the back side of the display device faces another portion of the back side of the display device. The force sensor may sense second pressure applied to the flexible display module when the flexible display module is in the folded-outward mode.

In some embodiments, the force sensor may sense a variation in capacitance to measure the second pressure in the folded-outward mode.

In some embodiments, the force sensor may include a strain gauge.

In some embodiments, the light-emitting device may include a front surface light emitting area and a back surface light emitting area, and the display panel may be a both surface light-emitting display panel.

In some embodiments, the light-emitting device may include a first reflection layer, a first anode, a second anode, a light-emitting layer, a cathode, and a second reflection layer. The first reflection layer may be disposed on a base surface and may overlap with the front surface light emitting area. The first anode may be disposed on the first reflection layer and may overlap with the front surface light emitting area. The second anode may be disposed on the base surface and may overlap with the back surface light emitting area. The light-emitting layer may be disposed on the first anode and the second anode and may overlap with the front surface light emitting area and the back surface light emitting area. The cathode may be disposed on the light-emitting layer and may overlap with the front surface light emitting area and the back surface light emitting area. The second reflection layer may be disposed on the cathode and may overlap with the back surface light emitting area.

In some embodiments, the display device may further include a first force sensor disposed between the second reflection layer and the sensor unit and sensing the first pressure.

In some embodiments, the display device may further include a first force sensor and a reflection member. The first force sensor may be disposed on the second reflection layer to sense the first pressure. The reflection member may be disposed on the first force sensor and may overlap with the front surface light emitting area and the back surface light emitting area.

In an aspect, a display device may include a flexible display module and a force sensor may provide a display surface on which an image is displayed. The flexible display module may include a first display panel further including a light-emitting device and a sensor unit disposed on the first display panel, wherein the display device further comprises a back side which is opposite to the side of the display surface where the image is displayed, the flexible display module having a folded-outward mode in which the flexible display module is folded such that a portion of the back side of the display device faces another portion of the back side of the display device. The force sensor may be disposed under the first display panel, and the force sensor may sense pressure applied to the flexible display module when the flexible display module is in a folded-outward mode.

In some embodiments, the force sensor may sense a variation in capacitance to measure the pressure in the folded-outward mode.

In an aspect, a display device may include a flexible display module and may provide a display surface on which an image is displayed. The flexible display module may include a display panel including a light-emitting device and a sensor unit disposed on the display panel. The sensor unit may sense a capacitance between one portion of the display surface and another portion of the display surface in a folded-in mode in which the flexible display module is folded such that the one portion of the display surface faces the another portion of the display surface.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 3 is a cross-sectional view illustrating a display device according to some exemplary embodiments.

FIG. 15A is a cross-sectional view taken along a line III-III' of FIG. 13A to illustrate a display device according to some exemplary embodiments.

FIG. 15B is a cross-sectional view taken along a line IV-IV' of FIG. 13B to illustrate a display device according to some exemplary embodiments.

DETAILED DESCRIPTION OF THE ILLUSTRATED EMBODIMENTS

Figure 1A:
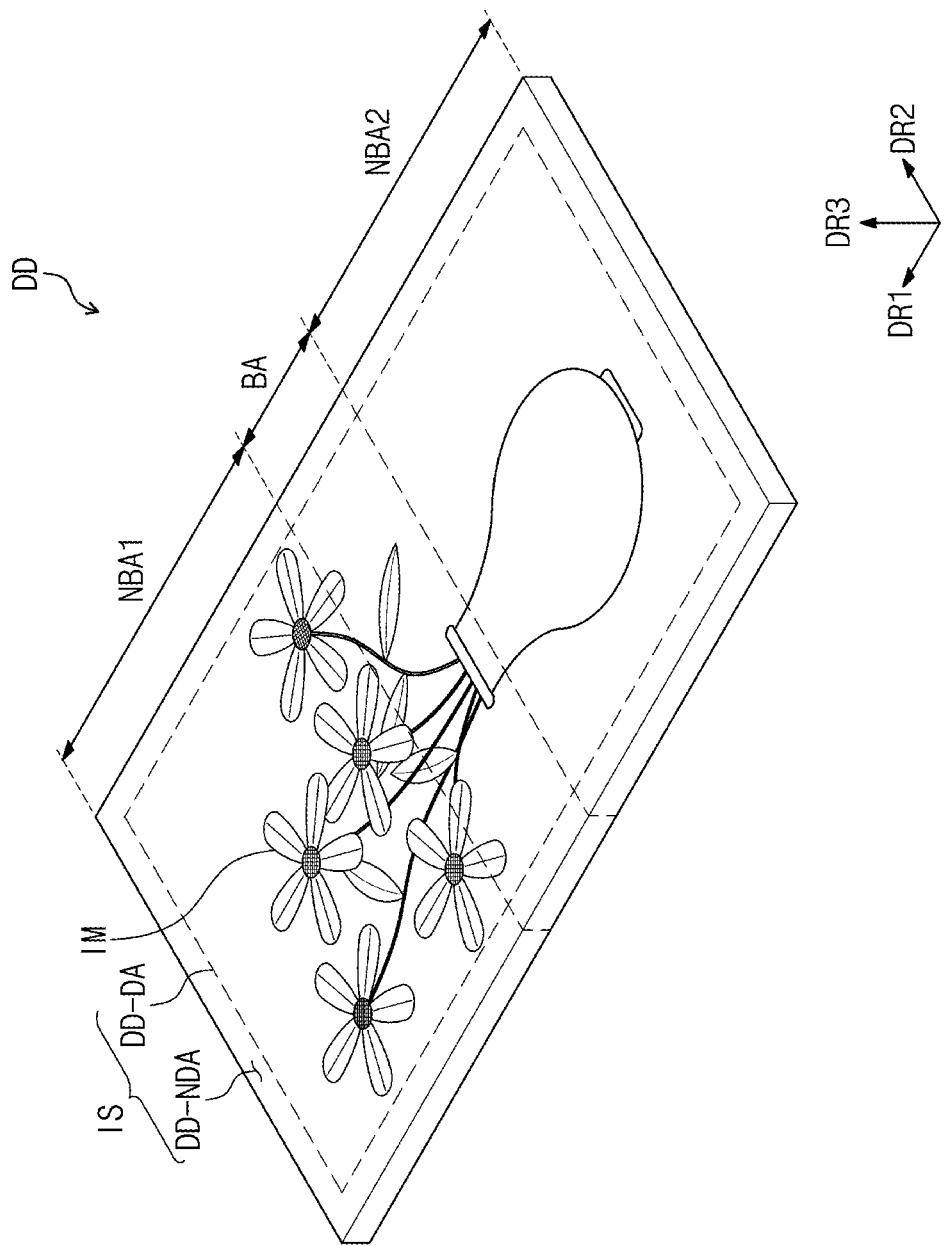
FIG. 1A is a perspective view illustrating a display device in a normal mode, according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
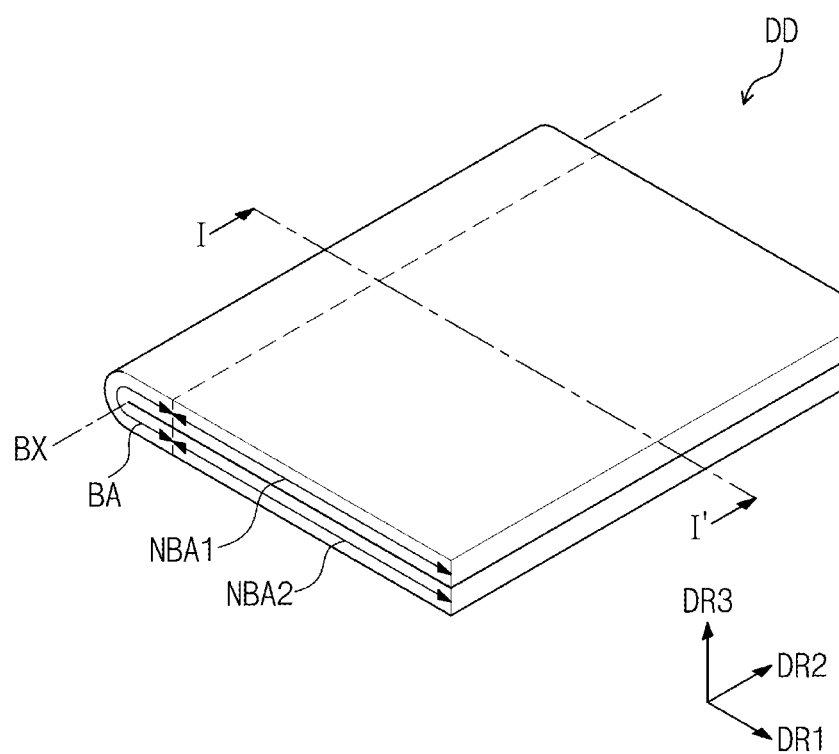
FIG. 1B is a perspective view illustrating the display device of FIG. 1A in a folded-in mode.

FIG. 1A is a perspective view illustrating a display device DD in a normal mode, according to an exemplary embodiment. FIG. 1B is a perspective view illustrating the display device DD of FIG. 1A in a folded-in mode.

As illustrated in FIG. 1A, in a normal mode, a display surface IS on which an image IM is displayed is parallel to a plane defined by a first directional axis DR1 and a second directional axis DR2. A normal direction of the display surface IS (i.e., a thickness direction of the display device DD) is parallel to a third directional axis DR3. A front surface (or a top surface) and a back surface (or a bottom surface) of each of members are defined along the third directional axis DR3. However, directions indicated by the first to third directional axes DR1, DR2, and DR3 may be relative directions and may be changed into other directions. Hereinafter, first to third directions are the directions respectively indicated by the first to third directional axes DR1, DR2, and DR3 and are indicated by the same reference designators as the first to third directional axes DR1, DR2, and DR3. In the present embodiment, a flexible display device is illustrated. However, embodiments of the inventive concepts are not limited thereto. In certain embodiments, the display device DD according to the present embodiment may be a flat display device.

FIGS. 1A and 1B illustrate a foldable display device as an example of the display device DD. However, the display device DD according to the exemplary embodiments may be, but not limited to, a rollable display device. The display device DD according to the exemplary embodiments may be used in large-sized electronic devices (e.g., televisions and monitors) and small and middle-sized electronic devices (e.g., portable phones, tablets, car navigation units, game consoles, and smart watches).

As illustrated in FIG. 1A, the display surface IS of the display device DD may include a plurality of areas. The display device DD includes a display area DD-DA and a non-display area DD-NDA adjacent to the display area DD-DA. The image IM is displayed in the display area DD-DA. An image is not displayed in the non-display area DD-NDA. A flower vase image is illustrated as an example of the image IM in FIG. 1A. For example, the display area DD-DA may have a quadrilateral shape. The non-display area DD-NDA may surround the display area DD-DA. However, embodiments of the inventive concepts are not limited thereto. The shapes of the display area DD-DA and the non-display area DD-NDA may take various other shapes and forms without departing from the scope of the inventive concepts.

Even though not shown in the drawings, the display device DD may include a housing. The housing may be disposed at an outer periphery of the display device DD and may receive internal parts of the display device DD.

As illustrated in FIGS. 1A and 1B, the display device DD may include a plurality of areas defined according to an operation mode. The display device DD may include a bending area BA bent on the basis of a bending axis BX, a first non-bending area NBA1, and a second non-bending area NBA2. The first and second non-bending areas NBA1 and NBA2 are not bent.

As illustrated in FIG. 1B, the display device DD may be bent inwards such that the display surface IS of the first non-bending area NBA1 faces the display surface IS of the second non-bending area NBA2. The bending state in which the display surface IS of the first non-bending area NBA1 faces the display surface IS of the second non-bending area NBA2 is defined as a folded-in mode. A state illustrated in FIG. 1A, in which display device DD is not in the folded-in mode, may be defined as a normal mode.

In some embodiments, the display device DD may include a plurality of bending areas BA. As shown in FIG. 1B, the bending area BA may be defined or designed to be parallel to the second directional axis DR2. In addition, the bending area BA may be defined or designed to correspond to a manner in which a user operates the display device DD. For example, the bending area BA may be defined or designed to be parallel to the first directional axis DR1 or may be defined or designed in a diagonal direction, unlike FIG. 1B. An area (or size) of the bending area BA may not be fixed but may be determined according to a radius of curvature. In some embodiments of the inventive concepts, the display device DD may be repeatedly operated only between the operation modes illustrated in FIGS. 1A and 1B.

Figure 2A:
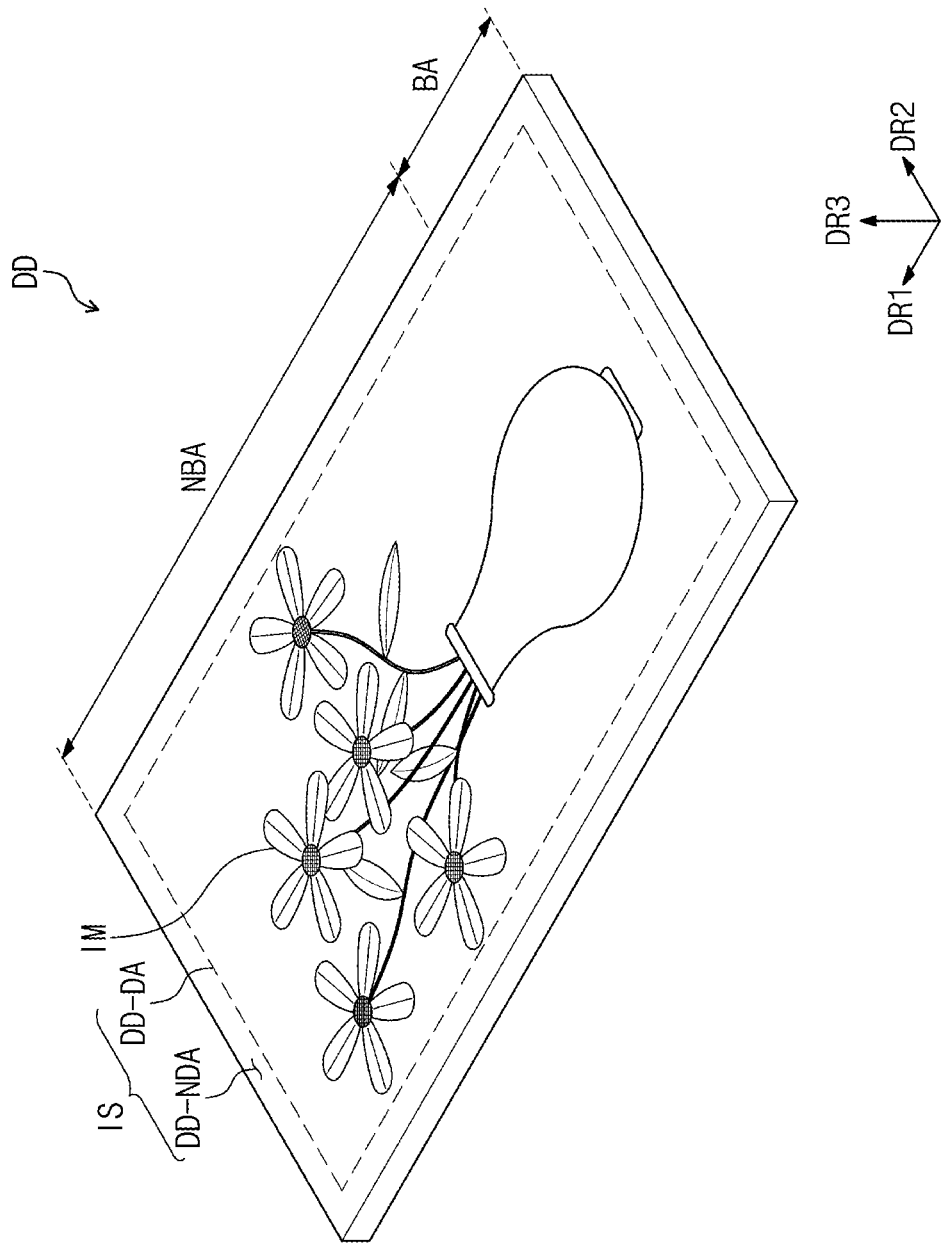
FIG. 2A is a perspective view illustrating a display device in a normal mode, according to some exemplary embodiments.
Figure 2B:
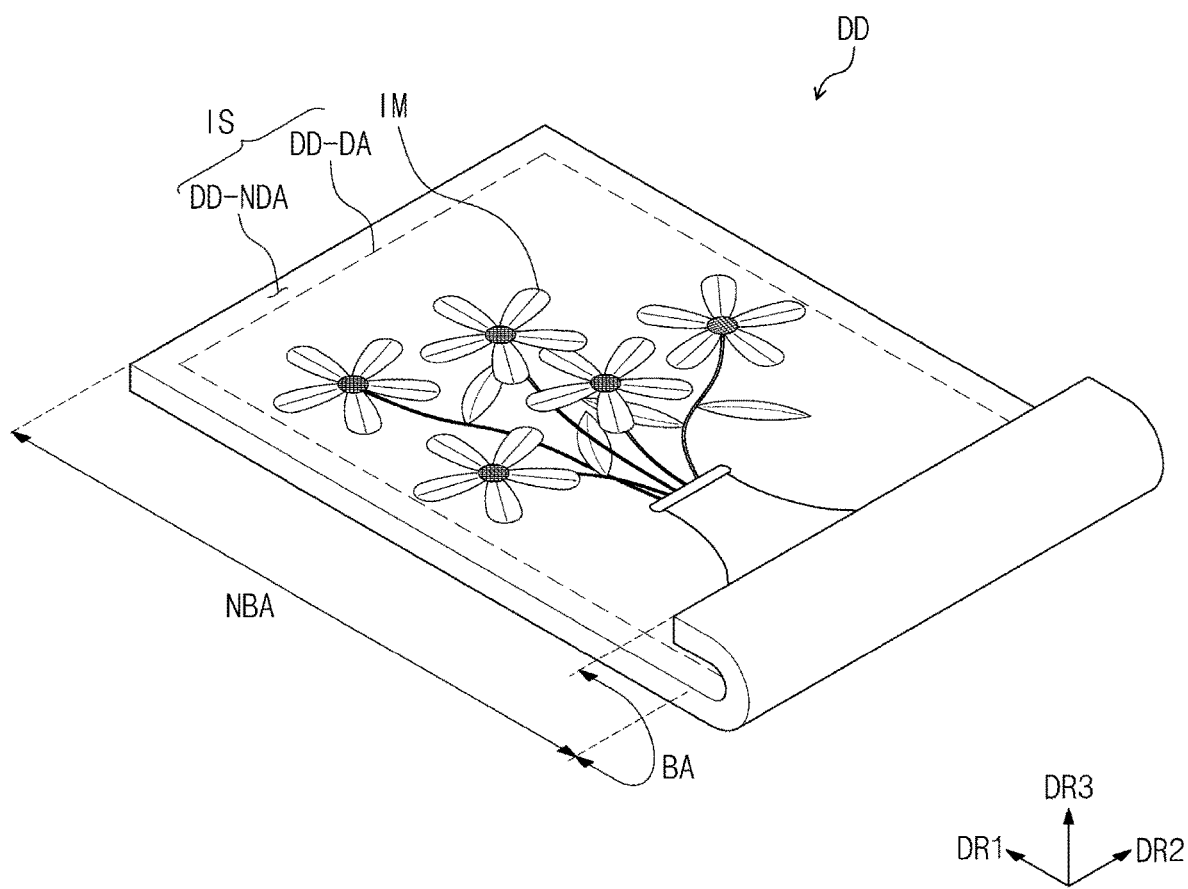
FIG. 2B is a perspective view illustrating the display device of FIG. 2A in a folded-in mode.

FIG. 2A is a perspective view illustrating a display device DD in a normal mode, according to some embodiments of the inventive concepts. FIG. 2B is a perspective view illustrating the display device DD of FIG. 2A in a folded-in mode. FIGS. 2A and 2B illustrate an example of a display device DD of which a folding portion is different from that of the display device DD illustrated in FIGS. 1A and 1B. As such, embodiments of the inventive concepts are not limited to any number of bending areas BA and non-bending areas NBA of the display device DD or any position of bending areas BA of the display device DD.

FIG. 3 is a cross-sectional view illustrating a display device DD according to an exemplary embodiment of the inventive concepts. FIG. 3 illustrates a cross section defined by the second directional axis DR2 and the third directional axis DR3.

As illustrated in FIG. 3, the display device DD includes a protective film PM, a window WM, a display module DM, a first adhesive member AM1, and a second adhesive member AM2. The display module DM is disposed between the protective film PM and the window WM. The first adhesive member AM1 couples the display module DM and the protective film PM to each other, and the second adhesive member AM2 couples the display module DM and the window WM to each other. In some exemplary embodiments, the first adhesive member AM1 and the second adhesive member AM2 may be omitted. Each of the protective film PM and the window WM may be continuously formed through a coating process.

The protective film PM protects the display module DM. The protective film PM provides or includes a first outer surface OS-L exposed outward and an adhesive surface adhered to the first adhesive member AM1. The protective film PM prevents external moisture from permeating into the display module DM and may absorb energy from an external impact.

The protective film PM may include a plastic film as a base layer. The protective film PM may include a plastic film, the plastic film being one selected from a group including polyethersulphone (PES), polyacrylate (PAR), polyetherimide (PEI), polyethyelene napthalate (PEN), polyethyeleneterepthalate (PET), polyphenylene sulfide (PPS), polyallylate, polyimide (PI), polycarbonate (PC), poly(aryleneether sulfone), and any combination thereof.

The material of the protective film PM is not limited to plastic resins, and may include an organic/inorganic composite material. For example, the protective film PM may include a porous organic layer and an inorganic material filling pores of the porous organic layer. The protective film PM may further include a functional layer formed on the plastic film. The functional layer may include a resin layer. The functional layer may be formed by a coating method.

The window WM may protect the display module DM from an external impact and may provide an input surface to a user. The window WM provides or includes a second outer surface OS-U exposed outward and an adhesive surface adhered to the second adhesive member AM2. The display surface IS illustrated in FIGS. 1A and 1B may be the second outer surface OS-U. The second outer surface OS-U may be a touch sensing surface for sensing a touch of a user.

In the display devices DD illustrated in FIGS. 1A, 1B, 2A, and 2B, the window WM may not be disposed in the bending area BA. However, embodiments of the inventive concepts are not limited thereto. In certain embodiments, the window WM may also be disposed in the bending area BA.

The display module DM includes a display panel DP and a sensor unit TS which may be integrally formed with each other by continuous processes. The display panel DP may include a light-emitting device. The display panel DP generates an image IM (see FIG. 1A) corresponding to inputted image data. The display panel DP provides or includes a first display panel surface BS1-L and a second display panel surface BS1-U, which are opposite to each other in the thickness direction DR3. A process of forming the display panel DP may include a low-temperature polycrystalline silicon (LTPS) process or a low-temperature polycrystalline oxide (LTPO) process.

The sensor unit TS obtains information of coordinates of external input. The sensor unit TS may be disposed directly on the second display panel surface BS1-U. In the present exemplary embodiment, the sensor unit TS may be integrally formed with the display panel DP by the continuous processes.

Even though not shown in the drawings, the display module DM according to some embodiments of the inventive concepts may further include an anti-reflection layer. The anti-reflection layer may include a color filter, a stack structure of a conductive layer/a dielectric layer/a conductive layer, or an optical member. The anti-reflection layer may absorb, destructively interfere with, or polarize light incident from the outside to reduce reflexibility of external light.

Each of the first and second adhesive members AM1 and AM2 may be an optically clear adhesive (OCA) film, an optically clear resin (OCR), or a pressure sensitive adhesive (PSA) film. Each of the first and second adhesive members AM1 and AM2 may include, but not limited to, a photo-curing adhesive material or a thermosetting adhesive material.

Even though not shown in the drawings, the display device DD may further include a frame structure that supports the functional layers to maintain the states illustrated in FIGS. 1A, 1B, 2A, and 2B. The frame structure may include a joint structure or a hinge structure.

In some embodiments, the sensor unit TS may be single-layered. In other words, the sensor unit TS may include a single conductive layer. Here, the single conductive layer means that a conductive layer may form a pattern separated by an insulating material in the same layer. A stack structure of a first metal layer/a second metal layer/a metal oxide layer corresponds to a single conductive layer, and a stack structure of a metal layer/an insulating layer/a metal oxide layer corresponds to a double conductive layer.

The single conductive layer is patterned to form a plurality of touch sensors and a plurality of touch signal lines. In other words, the touch sensors of the sensor unit TS may be disposed on the same layer. The touch sensors may be disposed directly on a thin film sealing layer TFE. In addition, a portion of each of the touch signal lines may be disposed on the same layer as the touch sensors.

The touch signal lines and the touch sensors may include indium-tin oxide (ITO), indium-zinc oxide (IZO), zinc oxide (ZnO), indium-tin-zinc oxide (ITZO), PEDOT, metal nanowire, and/or graphene. The touch signal lines and the touch sensors may include a metal layer, e.g., molybdenum, silver, titanium, copper, aluminum, or any alloy thereof. The touch signal lines and the touch sensors may include the same material or materials different from each other.

However, embodiments of the inventive concepts are not limited thereto. In certain embodiments, the sensor unit TS may have a multi-layered structure including a plurality of conductive layers.

Figure 4:
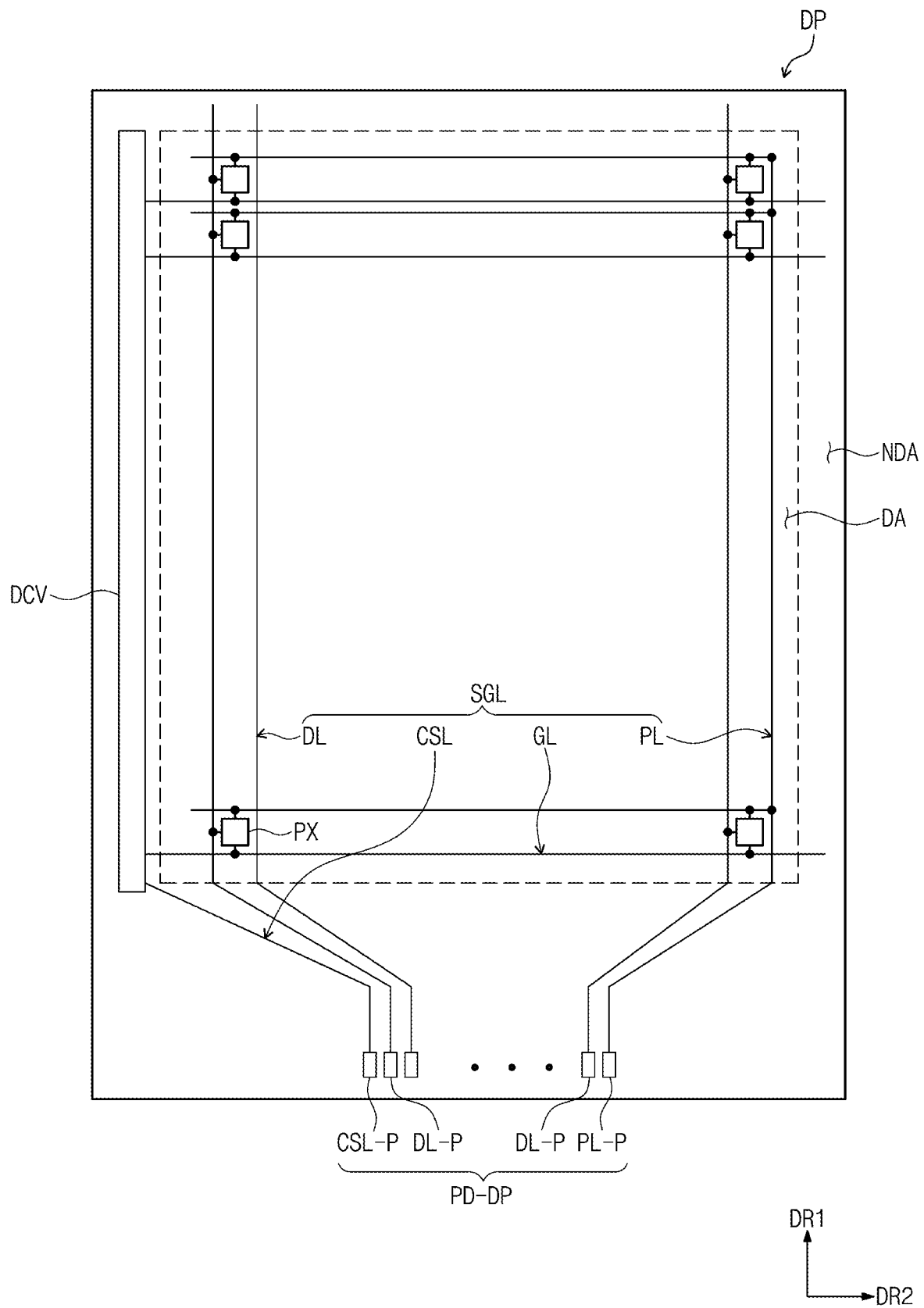
FIG. 4 is a plan view illustrating a display panel according to some exemplary embodiments.
Figure 5:
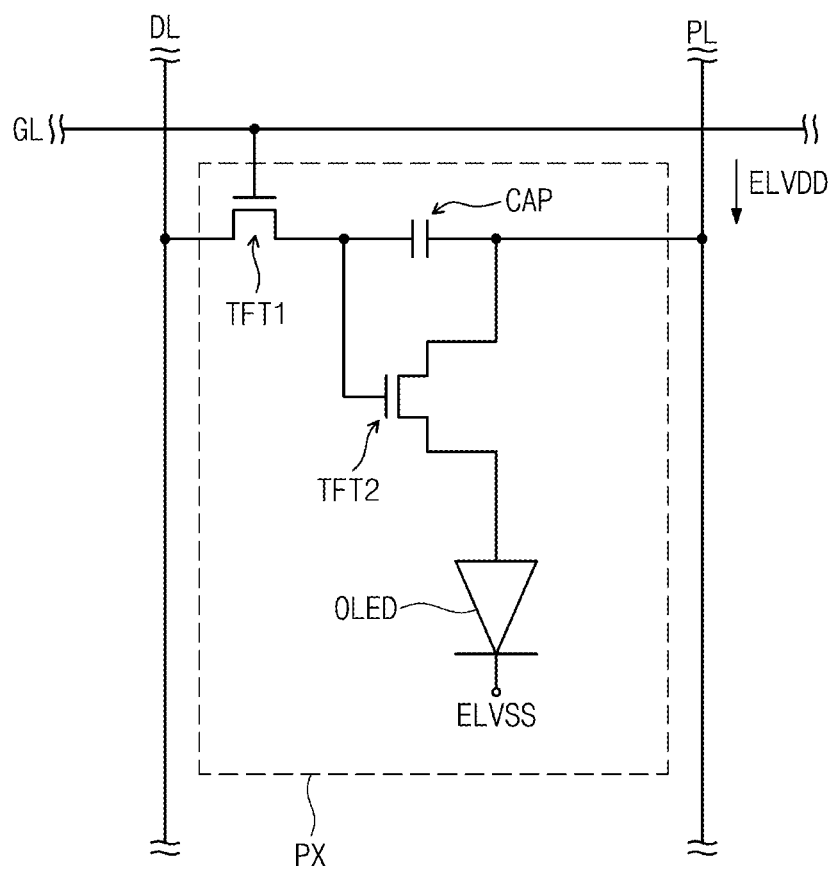
FIG. 5 is an equivalent circuit diagram of a pixel according to some exemplary embodiments.
Figure 6:
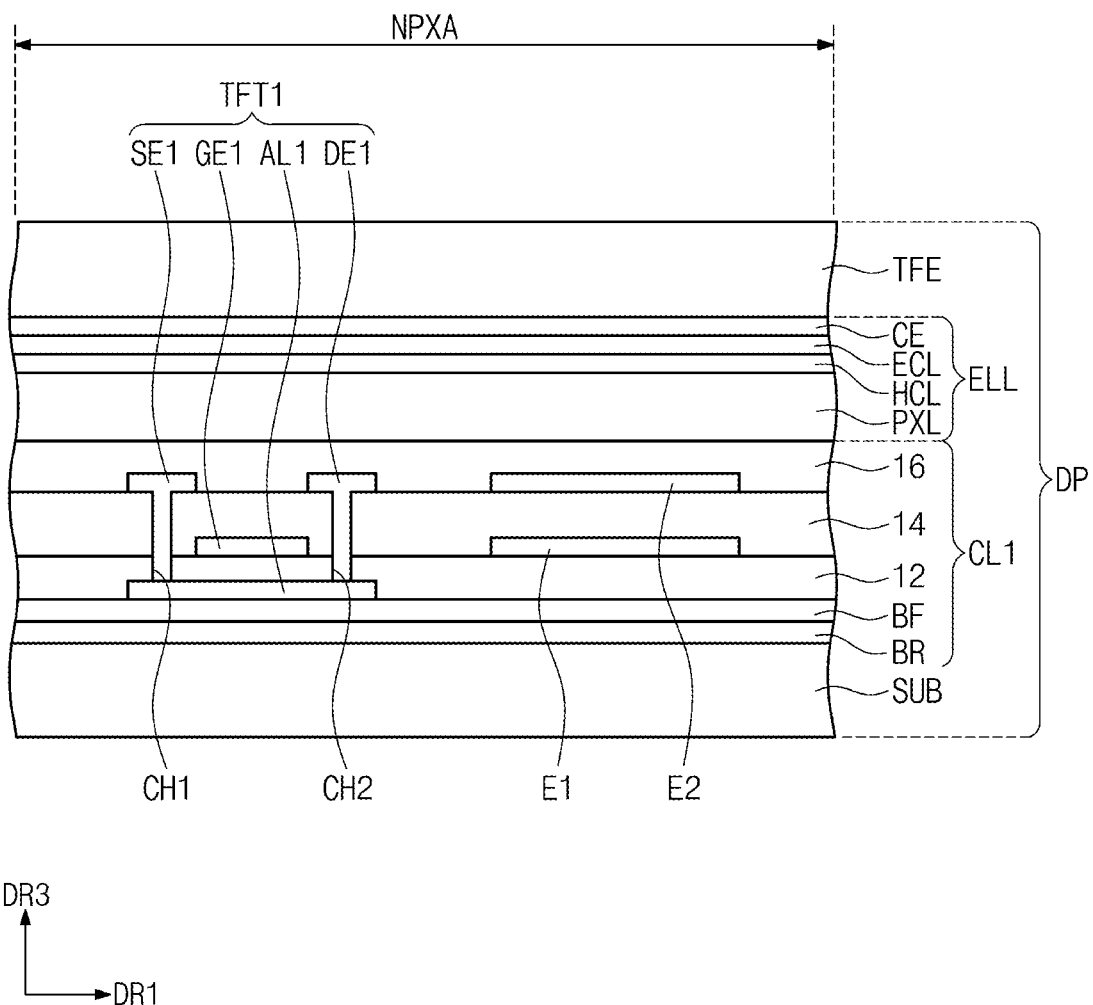
FIGS. 6 and 7 are partial cross-sectional views illustrating a display panel according to some exemplary embodiments.
Figure 7:
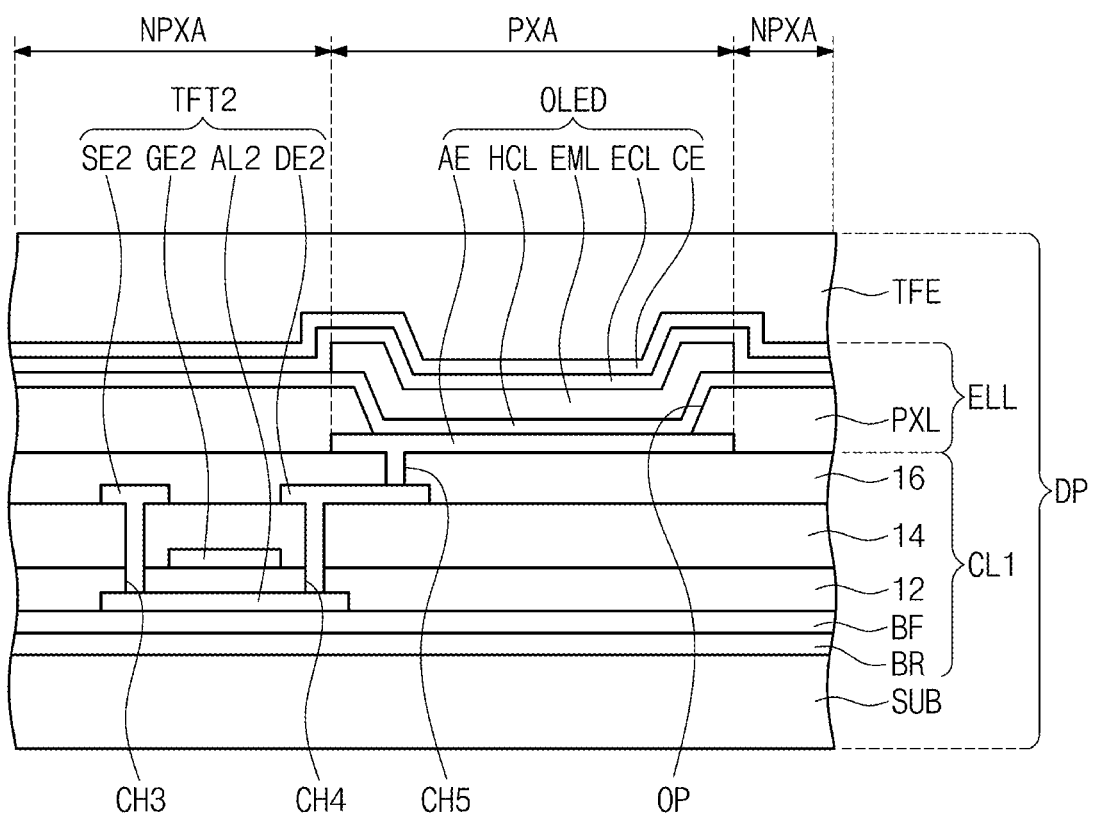

FIG. 4 is a plan view illustrating a display panel DP according to an exemplary embodiment of the inventive concepts. FIG. 5 is an equivalent circuit diagram of a pixel PX according to an exemplary embodiment of the inventive concepts. FIGS. 6 and 7 are partial cross-sectional views illustrating a display panel DP according to an exemplary embodiment of the inventive concepts.

As illustrated in FIG. 4, the display panel DP includes a display area DA and a non-display area NDA when viewed in a plan view. The display area DA and the non-display area NDA of the display panel DP correspond to the display area DD-DA and the non-display area DD-NDA of the display device DD in FIGS. 1A, 2A, 2B, respectively. However, the display area DA and the non-display area NDA of the display panel DP may not need to be the same as the display area DD-DA and the non-display area DD-NDA of the display device DD but may be changed according to a structure and/or a design of the display panel DP.

The display panel DP includes a plurality of signal lines SGL and a plurality of pixels PX. The display area DA is defined as an area in which the plurality of pixels PX is disposed. In the present embodiment, the non-display area NDA may be defined along a border of the display area DA.

The plurality of signal lines SGL may include gate lines GL, data lines DL, a power line PL, and a control signal line CSL. Each of the gate lines GL is connected to corresponding ones of the plurality of pixels PX, and each of the data lines DL is connected to corresponding ones of the plurality of pixels PX. The power line PL is connected to the plurality of pixels PX. A gate driving circuit DCV to which the gate lines GL are connected may be disposed in one side portion of the non-display area NDA. The control signal line CSL may provide control signals to the gate driving circuit DCV.

One or some of the gate lines GL, the data lines DL, the power line PL and the control signal line CSL may be disposed on one layer, and another or others of the gate lines GL, the data lines DL, the power line PL and the control signal line CSL may be disposed on another layer different from the one layer. The gate lines GL, the data lines DL, the power line PL and the control signal line CSL disposed on the one layer may be defined as first signal lines, and the signal lines disposed on the another layer may be defined as second signal lines. The signal lines disposed on still another layer may be defined as third signal lines.

Each of the gate lines GL, the data lines DL, the power line PL and the control signal line CSL may include a signal interconnection portion and a display panel pad PD-DP connected to an end of the signal interconnection portion. The signal interconnection portion may be defined as a portion of each of the gate lines GL, the data lines DL, the power line PL and the control signal line CSL except the display panel pads PD-DP.

The display panel pads PD-DP may be formed in the same process as transistors for driving the pixels PX. For example, the display panel pads PD-DP may be formed in the same low-temperature polycrystalline silicon (LTPS) process or low-temperature polycrystalline oxide (LTPO) process as the transistors for driving the pixels PX.

In some embodiments, the display panel pads PD-DP may include a control pad CSL-P, a data pad DL-P, and a power pad PL-P. A gate pad is not illustrated. However, the gate pad may overlap with the gate driving circuit DCV and may be connected to the gate driving circuit DCV. Even though not indicated in the drawings, a portion of the non-display area NDA, in which the control pad CSL-P, the data pad DL-P and the power pad PL-P are arranged, may be defined as a pad area. As described later, pads of the sensor unit TS may be disposed to be adjacent to the display panel pads PD-DP described above.

The pixel PX connected to one gate line GL, one data line DL and the power line PL is illustrated as an example in FIG. 5. However, the configuration of the pixel PX is not limited to FIG. 5 but may be variously modified.

The pixel PX includes a light-emitting device OLED used as a display element. The light-emitting device OLED may be a front surface light-emitting type diode or a back surface light-emitting type diode. Alternatively, the light-emitting device OLED may be a both surface light-emitting type diode. The pixel PX includes a first transistor TFT1 (or a switching transistor), a second transistor TFT2 (or a driving transistor) and a capacitor CAP which constitute a circuit part for driving the light-emitting device OLED. The light-emitting device OLED generates light by an electrical signal provided from the transistors TFT1 and TFT2.

The first transistor TFT1 outputs a data signal applied to the data line DL in response to a scan signal applied to the gate line GL. The capacitor CAP is charged with a voltage corresponding to the data signal received from the first transistor TFT1.

The second transistor TFT2 is connected to the light-emitting device OLED. The second transistor TFT2 controls a driving current flowing through the light-emitting device OLED in response to the amount of charges stored in the capacitor CAP. The light-emitting device OLED emits light while the second transistor TFT2 is turned-on.

FIG. 6 is a cross-sectional view of a portion corresponding to the first transistor TFT1 and the capacitor CAP of the equivalent circuit illustrated in FIG. 5. FIG. 7 is a cross-sectional view of a portion corresponding to the second transistor TFT2 and the light-emitting device OLED of the equivalent circuit illustrated in FIG. 5.

As illustrated in FIGS. 6 and 7, a first circuit layer CL1 is disposed on a base layer SUB. A semiconductor pattern AL1 (hereinafter, referred to as 'a first semiconductor pattern') of the first transistor TFT1 and a semiconductor pattern AL2 (hereinafter, referred to as 'a second semiconductor pattern') of the second transistor TFT2 are disposed on the base layer SUB, or may be disposed on top of organic/inorganic layers BR, BF. Each of the first and second semiconductor patterns AL1 and AL2 may include at least one of amorphous silicon, poly-silicon, or a metal oxide semiconductor. Here, the first and second semiconductor patterns AL1 and AL2 may include the same material or different materials from each other.

The first circuit layer CL1 may include organic/inorganic layers BR, BF, 12, 14, and 16, the first transistor TFT1, the second transistor TFT2, and electrodes E1 and E2. The organic/inorganic layers BR, BF, 12, 14, and 16 may be a functional layer BR and BF, a first insulating layer 12, a second insulating layer 14, and a third insulating layer 16.

The functional layer BR and BF may be disposed on one surface of the base layer SUB. The functional layer BR and BF includes at least one of a barrier layer BR or a buffer layer BF. The first semiconductor pattern AL1 and the second semiconductor pattern AL2 may be disposed on the barrier layer BR or the buffer layer BF.

The first insulating layer 12 is disposed on the base layer SUB and covers the first semiconductor pattern AL1 and the second semiconductor pattern AL2. The first insulating layer 12 includes an organic layer and/or an inorganic layer. In particular, the first insulating layer 12 may include a plurality of inorganic thin layers. The plurality of inorganic thin layers may include a silicon nitride layer and a silicon oxide layer.

A control electrode GE1 (hereinafter, referred to as 'a first control electrode') of the first transistor TFT1 and a control electrode GE2 (hereinafter, referred to as 'a second control electrode') of the second transistor TFT2 are disposed on the first insulating layer 12. A first electrode E1 of the capacitor CAP is disposed on the first insulating layer 12. The first control electrode GE1, the second control electrode GE2, the first electrode E1, and the gate lines GL (see FIG. 5) may be formed using the same photolithography process. In other words, the first electrode E1 and the gate lines GL may have the same material and the same stack structure and may be disposed on the same layer.

The second insulating layer 14 is disposed on the first insulating layer 12 and covers the first control electrode GE1, the second control electrode GE2, and the first electrode E1. The second insulating layer 14 includes an organic layer and/or an inorganic layer. In particular, the second insulating layer 14 may include a plurality of inorganic thin layers. The plurality of inorganic thin layers may include a silicon nitride layer and a silicon oxide layer.

The data lines DL (see FIG. 5) may be disposed on the second insulating layer 14. An input electrode SE1 (hereinafter, referred to as 'a first input electrode') and an output electrode DE1 (hereinafter, referred to as 'a first output electrode') of the first transistor TFT1 are disposed on the second insulating layer 14. An input electrode SE2 (hereinafter, referred to as 'a second input electrode') and an output electrode DE2 (hereinafter, referred to as 'a second output electrode') of the second transistor TFT2 are disposed on the second insulating layer 14. The first input electrode SE1 is branched from one of the corresponding data lines DL. The power line PL (see FIG. 5) and the data lines DL may be disposed on the same layer. The second input electrode SE2 may be branched from the power line PL.

A second electrode E2 of the capacitor CAP is disposed on the second insulating layer 14. The second electrode E2, the data lines DL and the power line PL may be formed using the same photolithography process, may have the same material and the same stack structure, and may be disposed on the same layer.

The first input electrode SE1 and the first output electrode DE1 are connected to portions of the first semiconductor pattern AL1 through a first through-hole CH1 and a second through-hole CH2 penetrating the first and second insulating layers 12 and 14, respectively. The first output electrode DE1 may be electrically connected to the first electrode E1. For example, the first output electrode DE1 may be connected to the first electrode E1 through a through-hole (not shown) penetrating the second insulating layer 14. The second input electrode SE2 and the second output electrode DE2 are connected to portions of the second semiconductor pattern AL2 through a third through-hole CH3 and a fourth through-hole CH4 penetrating the first and second insulating layers 12 and 14, respectively. Meanwhile, in other embodiments, the first transistor TFT1 and the second transistor TFT2 may have bottom gate structures.

The third insulating layer 16 is disposed on the second insulating layer 14 and covers the first input electrode SE1, the first output electrode DE1, the second input electrode SE2, and the second output electrode DE2. The third insulating layer 16 includes an organic layer and/or an inorganic layer. In particular, the third insulating layer 16 may include an organic material to provide a flat surface.

One of the first, second, and third insulating layers 12, 14, and 16 may be omitted according to a circuit structure of the pixel PX. Each of the second and third insulating layers 14 and 16 may be defined as an interlayer insulating layer. The interlayer insulating layer is disposed between a conductive pattern disposed thereunder and a conductive pattern disposed thereon to insulate the conductive patterns from each other.

A light-emitting device layer ELL is disposed on the third insulating layer 16. The light-emitting device layer ELL includes a pixel-defining layer PXL and the light-emitting device OLED. An anode AE is disposed on the third insulating layer 16. The anode AE is connected to the second output electrode DE2 through a fifth through-hole CH5 penetrating the third insulating layer 16. An opening OP is defined in the pixel-defining layer PXL. The opening OP of the pixel-defining layer PXL exposes at least a portion of the anode AE.

The light-emitting device layer ELL includes a light emitting area PXA and a non-light emitting area NPXA adjacent to the light emitting area PXA. The non-light emitting area NPXA may surround the light emitting area PXA. In the present embodiment, the light emitting area PXA is defined to correspond to the anode AE. However, the light emitting area PXA is not limited thereto. In other words, the light emitting area PXA is defined as an area from which light is generated. In certain embodiments, the light emitting area PXA may be defined to correspond to the portion of the anode AE, which is exposed by the opening OP.

A hole control layer HCL may be disposed in both the light emitting area PXA and the non-light emitting area NPXA. Even though not shown in the drawings, a common layer such as the hole control layer HCL may be formed in common for the plurality of pixels PX (see FIG. 4).

A light-emitting layer EML is disposed on the hole control layer HCL. The light-emitting layer EML may be disposed in only an area corresponding to the opening OP. In other words, the light-emitting layers EML of the pixels PX may be separated from each other.

The light-emitting layer EML may include an organic material or an inorganic material.

An electron control layer ECL is disposed on the light-emitting layer EML. A cathode CE is disposed on the electron control layer ECL. The cathode CE is disposed in common with the plurality of pixels PX.

In the present embodiment, a patterned light-emitting layer EML is illustrated as an example. In certain embodiments, the light-emitting layer EML may be disposed in common with the plurality of pixels PX. At this time, the light-emitting layer EML may generate white light. In some embodiments, the light-emitting layer EML may have a multi-layered structure.

In the present embodiment, a thin film sealing layer TFE directly covers the cathode CE. In some embodiments, a capping layer covering the cathode CE may further be disposed. In this case, the thin film sealing layer TFE may directly cover the capping layer. The thin film sealing layer TFE may include an organic layer including an organic material and an inorganic layer including an inorganic material.

Figure 8:
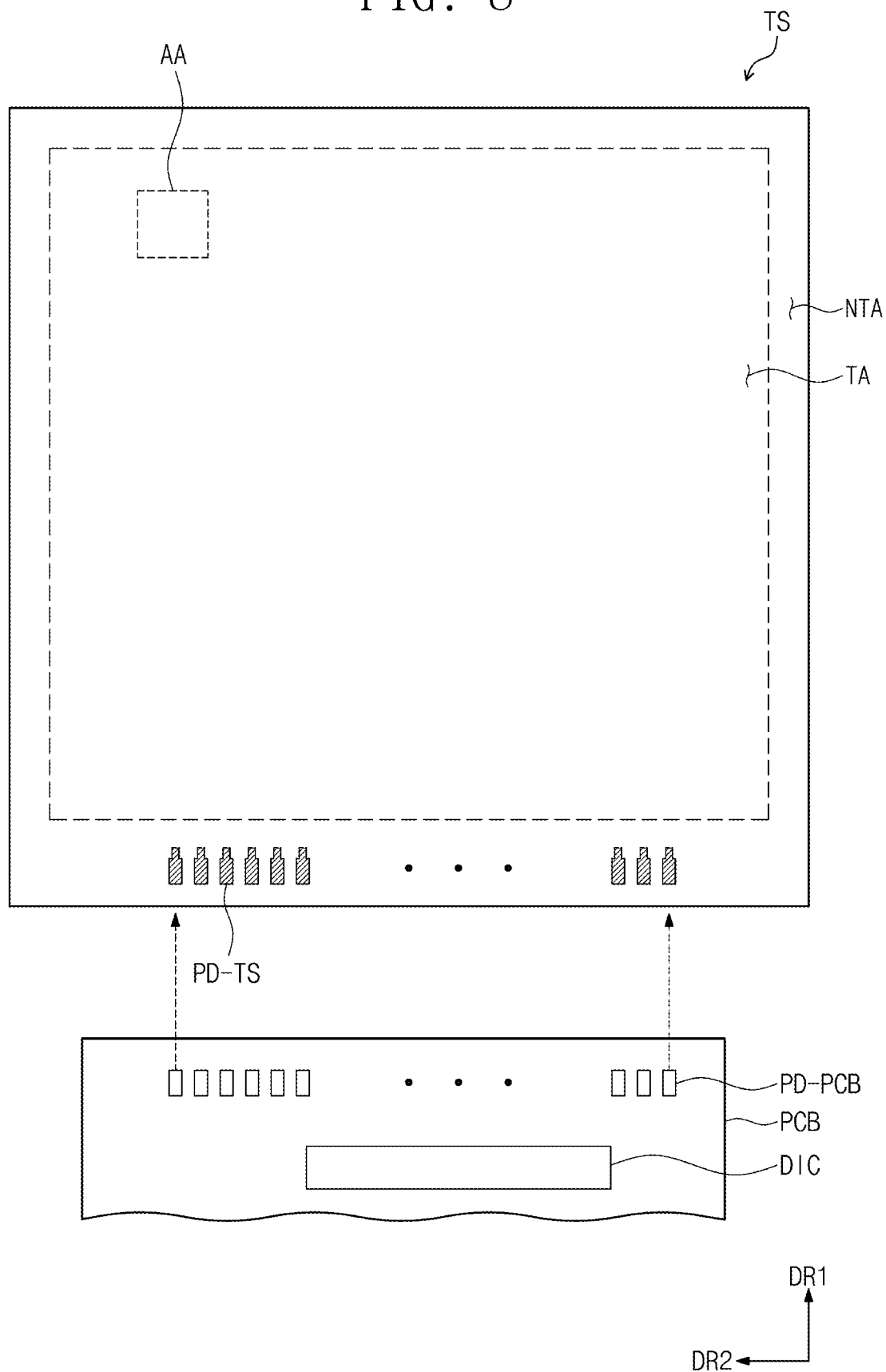
FIG. 8 is a plan view illustrating a sensor unit of a display module according to some exemplary embodiments.

FIG. 8 is a plan view illustrating a sensor unit TS of a display module according to some embodiments of the inventive concepts. The sensor unit TS of the display module includes a touch sensing area TA and a non-touch sensing area NTA when viewed in a plan view.

The touch sensors for sensing a touch may be disposed in the touch sensing area TA. Touch signal lines for electrically connecting the touch sensors to sensor unit pads PD-TS may be disposed in the non-touch sensing area NTA.

The sensor unit pads PD-TS are electrically connected to pads PD-PCB of a printed circuit board PCB. An integrated circuit DIC may be disposed on the printed circuit board PCB. The integrated circuit DIC may be formed by a chip-on-flexible printed circuit (COF) method. The integrated circuit DIC may control the sensor unit TS.

In some embodiments, the integrated circuit DIC may control the display panel DP as well as the sensor unit TS.

Figure 9:
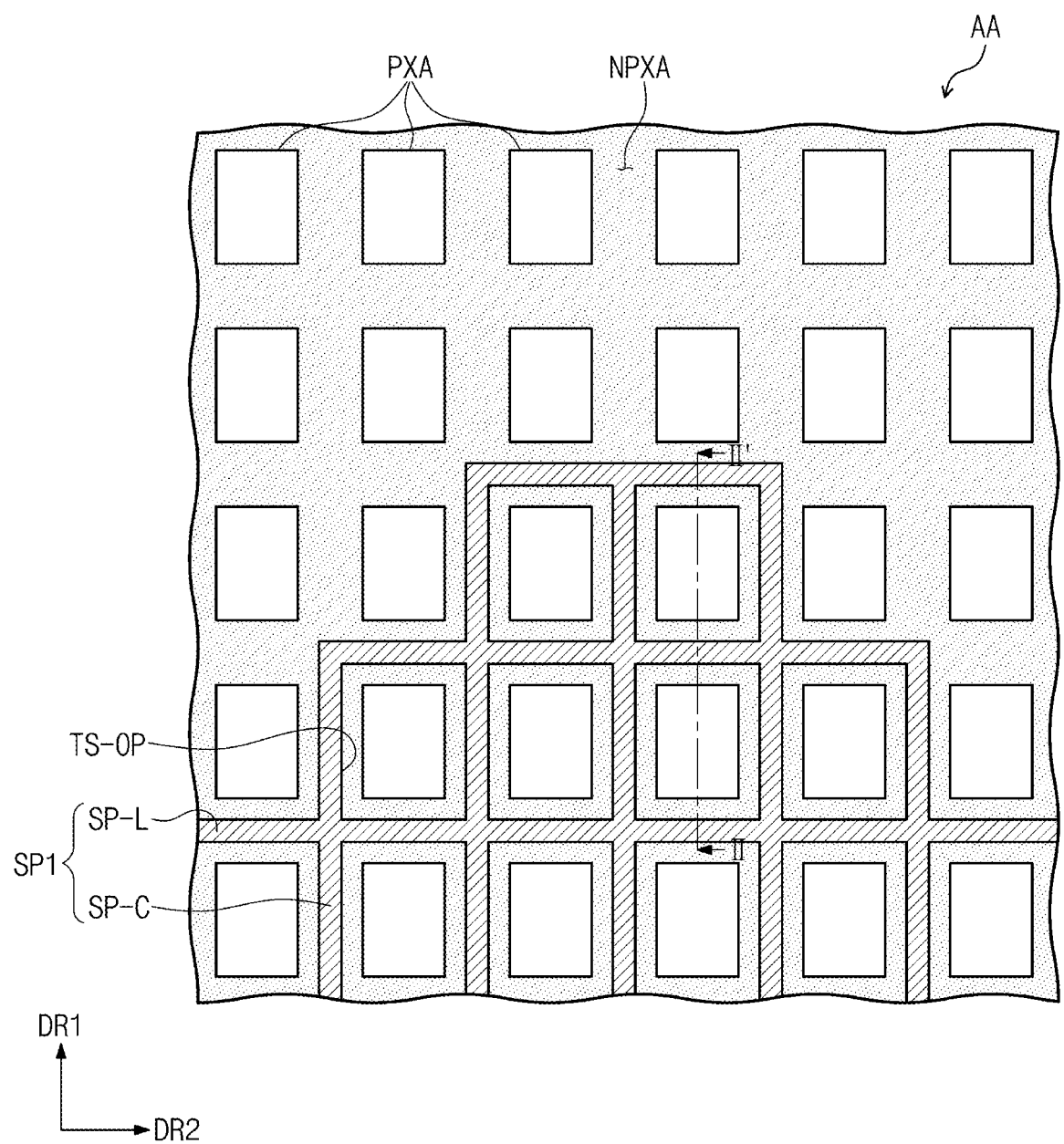
FIG. 9 is an enlarged view of a portion 'AA' of FIG. 8.
Figure 10A:
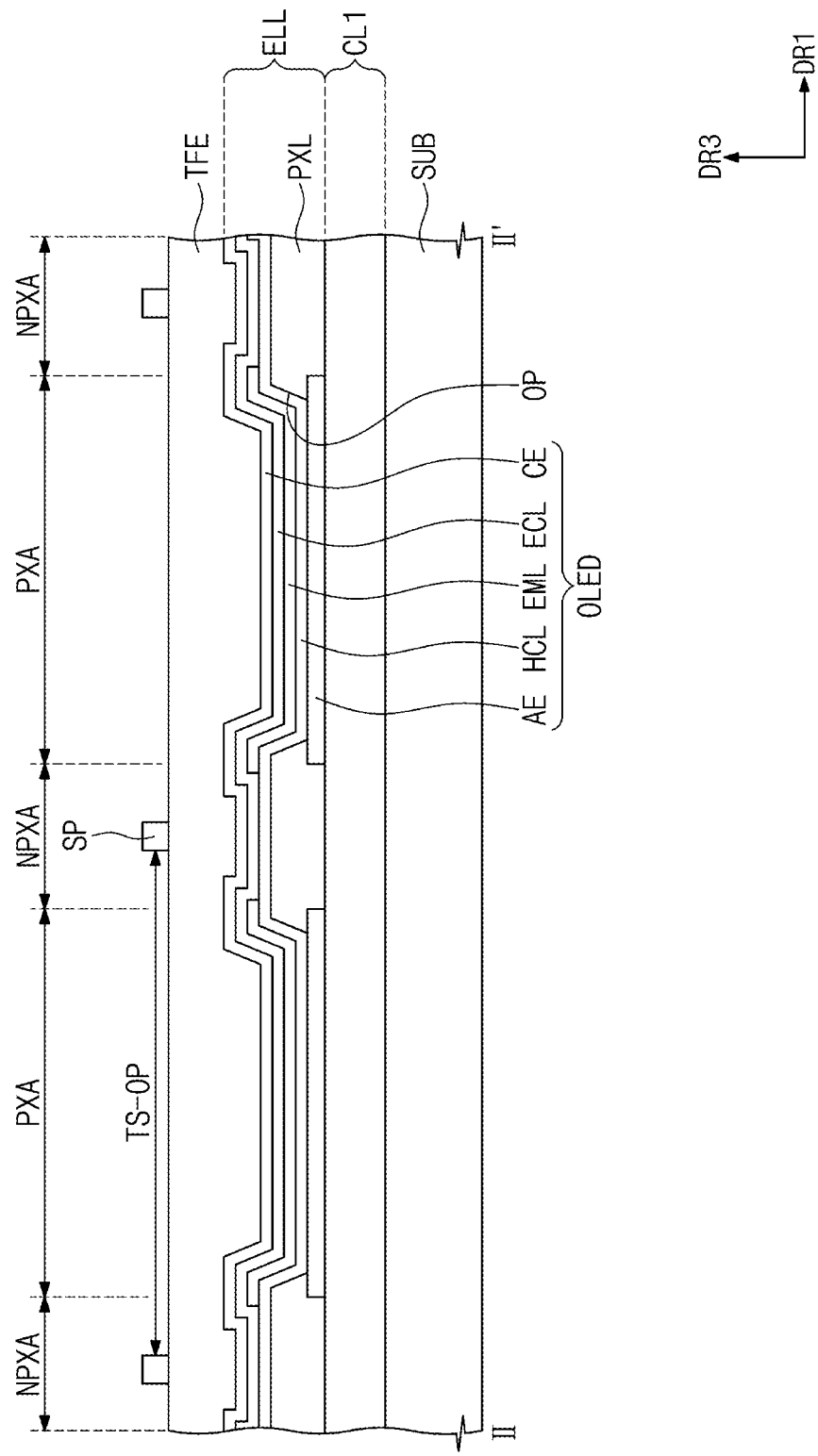
FIGS. 10A and 10B are cross-sectional views taken along a line II-II' of FIG. 9.
Figure 10B:
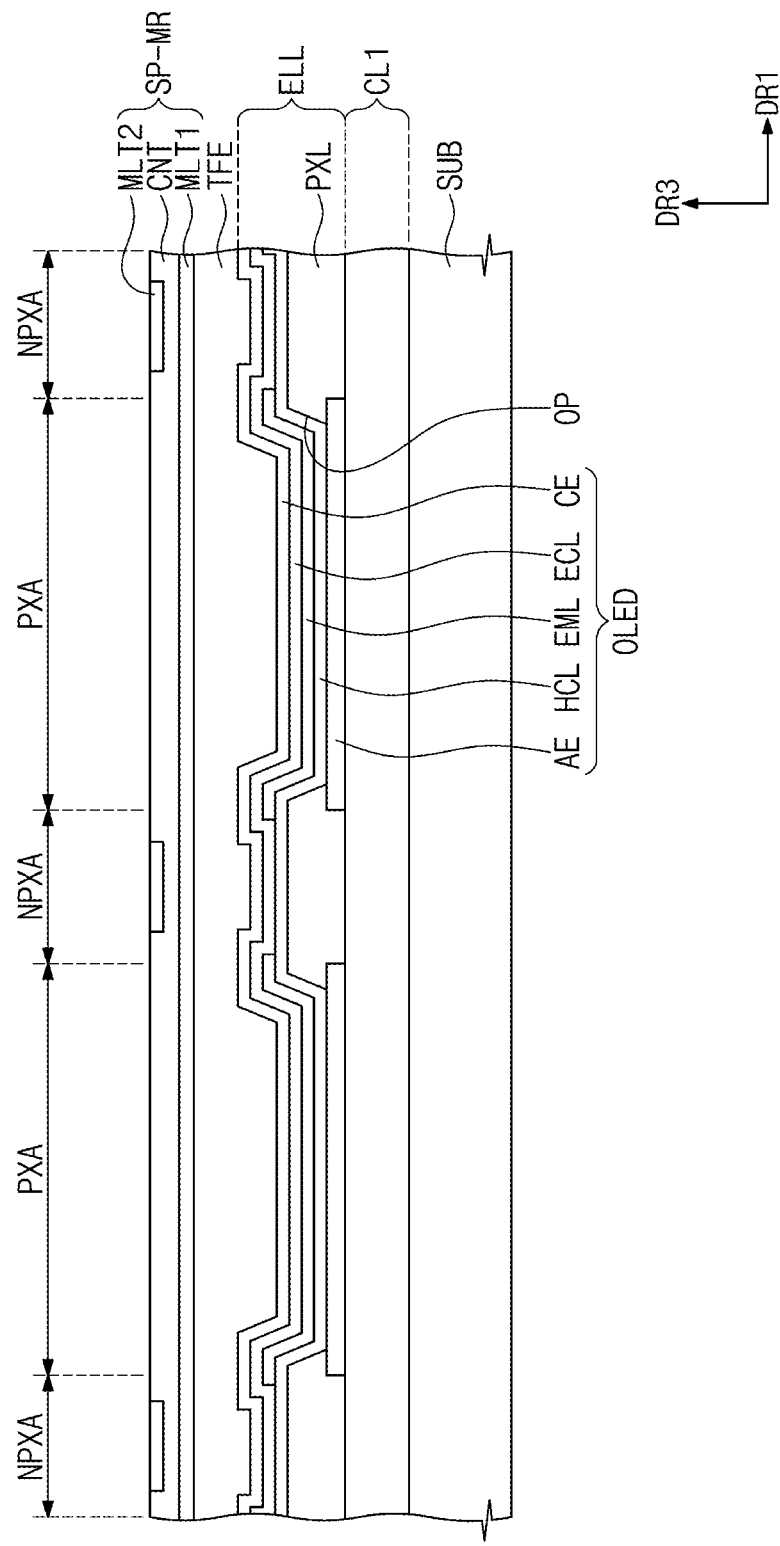

FIG. 9 is an enlarged view of a portion 'AA' of FIG. 8. FIGS. 10A and 10B are cross-sectional views taken along a line II-II' of FIG. 9.

Referring to FIGS. 9 and 10A, the display area DA includes a plurality of the light emitting areas PXA and the non-light emitting area NPXA surrounding the light emitting areas PXA. A touch sensor SP may have a mesh shape overlapping with the non-light emitting area NPXA.

The touch sensor SP includes a plurality of vertical portions SP-C extending in a first direction DR1 and a plurality of horizontal portions SP-L extending in a second direction DR2. The plurality of vertical portions SP-C and the plurality of horizontal portions SP-L may be defined as a mesh line. A width of the mesh line may be several micrometers.

The plurality of vertical portions SP-C and the plurality of horizontal portions SP-L are connected to each other to form a plurality of touch openings TS-OP. In the present embodiment, the touch openings TS-OP correspond to the light emitting areas PXA, respectively. However, exemplary embodiments of the inventive concepts are not limited thereto. In certain embodiments, one touch opening TS-OP may correspond to two or more light emitting areas PXA. FIGS. 9 and 10A illustrate the touch sensor SP exposed outward. Alternatively, the display module DM may further include an insulating layer that is disposed on the thin film sealing layer TFE to cover the touch sensor SP.

Referring to FIG. 10B, a touch sensor SP-MR may include a first touch electrode MLT1, an insulating pattern CNT, and a second touch electrode MLT2. The insulating pattern CNT insulates the first touch electrode MLT1 from the second touch electrode MLT2.

Each of the first and second touch electrodes MLT1 and MLT2 may reflect incident light. Thus, the first and second touch electrodes MLT1 and MLT2 may provide a mirror function to a user.

Figure 11A:
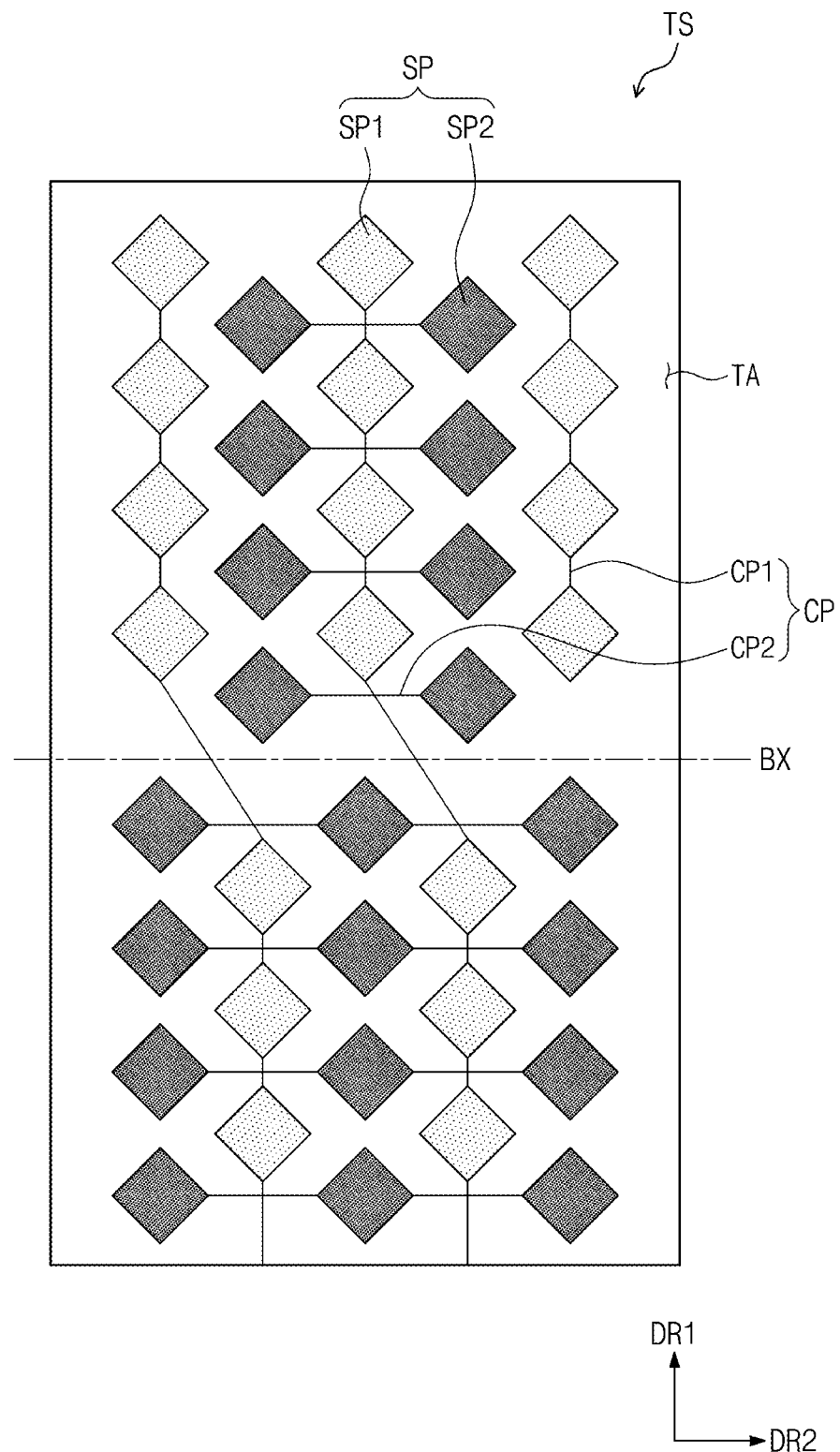
FIG. 11A is a plan view illustrating touch sensors disposed in a touch sensing area.
Figure 11B:
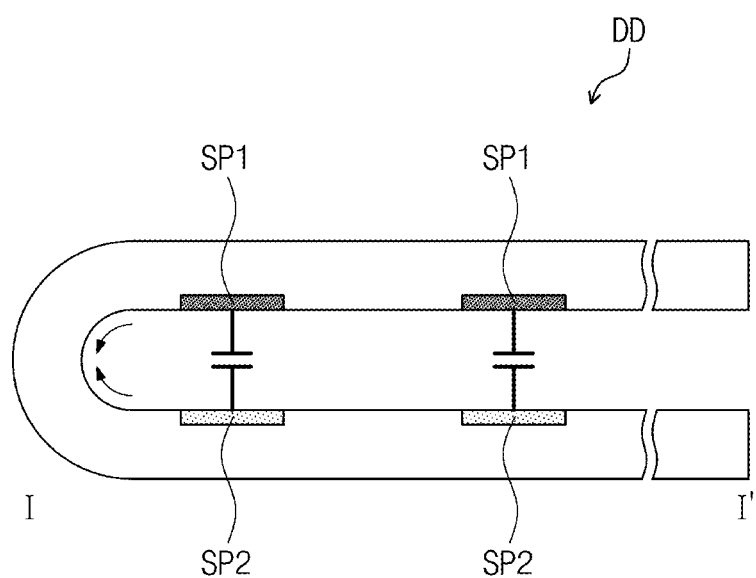
FIG. 11B is a cross-sectional view taken along a line I-I' of FIG. 1B to illustrate a display device according to some exemplary embodiments.

FIG. 11A is a plan view illustrating touch sensors SP disposed in a touch sensing area TA. FIG. 11B is a cross-sectional view taken along a line I-I' of FIG. 1B to illustrate a display device according to some embodiments of the inventive concepts.

Referring to FIG. 11A, a sensor unit TS includes touch sensors SP and connection patterns CP, which are disposed in the touch sensing area TA.

The touch sensors SP may include first touch sensors SP1 and second touch sensors SP2. The first touch sensors SP1 extend in the first direction DR1 and are arranged in the second direction DR2. Each of the first touch sensors SP1 may have a mesh shape in which a plurality of touch openings TS-OP is defined.

The second touch sensors SP2 may be insulated from the first touch sensors SP1 by insulating patterns CNT (see FIG. 10B). The insulating patterns CNT may include an inorganic material or an organic material. The inorganic material may include silicon oxide or silicon nitride. The organic material may include at least one of an acrylic-based resin, a meth-acrylic-based resin, polyisoprene, a vinyl-based resin, an epoxy-based resin, a urethane-based resin, a cellulose-based resin, or a perylene-based resin.

Each of the second touch sensors SP2 may have a mesh shape in which a plurality of touch openings TS-OP is defined.

The connection patterns CP may include first connection patterns CP1 and second connection patterns CP2. Each of the first connection patterns CP1 connects adjacent two of the first touch sensors SP1. Each of the second connection patterns CP2 connects adjacent two of the second touch sensors SP2.

In some embodiments, the first connection patterns CP1 or the second connection patterns CP2 may have a bridge function.

The first touch sensors SP1 may be capacitively coupled to the second touch sensors SP2.

In some exemplary embodiments, the first touch sensors SP1 may transmit electric fields, and the second touch sensors SP2 may receive the electric fields transmitted from the first touch sensors SP1.

In other exemplary embodiments, the second touch sensors SP2 may transmit electric fields, and the first touch sensors SP1 may receive the electric fields transmitted from the second touch sensors SP2.

The above mentioned shapes of the first and second touch sensors SP1 and SP2 are illustrated as examples. However, embodiments of the inventive concepts are not limited thereto. In certain exemplary embodiments, each of the first and second touch sensors SP1 and SP2 may have a bar shape having a uniform width.

The first touch sensors SP1 and the second touch sensors SP2 may be disposed symmetrically with respect to the bending axis BX.

Referring to FIG. 11B, the first touch sensor SP1 overlaps with the second touch sensor SP2 in the folded-in mode in which the display device DD is folded along the bending axis BX. At this time, the first touch sensor SP1 and the second touch sensor SP2 overlapping with each other are capacitively coupled to each other. When external pressure is applied, a capacitance between the first and second touch sensors SP1 and SP2 capacitively coupled to each other may be varied and the display device DD may sense the variation in the capacitance to measure the external pressure.

As described above, the display device DD may sense the touch of the user in the normal mode and may sense the pressure applied by the user in the folded-in mode. However, embodiments of the inventive concepts are not limited thereto. In certain embodiments, the sensor unit TS may not sense the applied pressure.

Figure 12A:
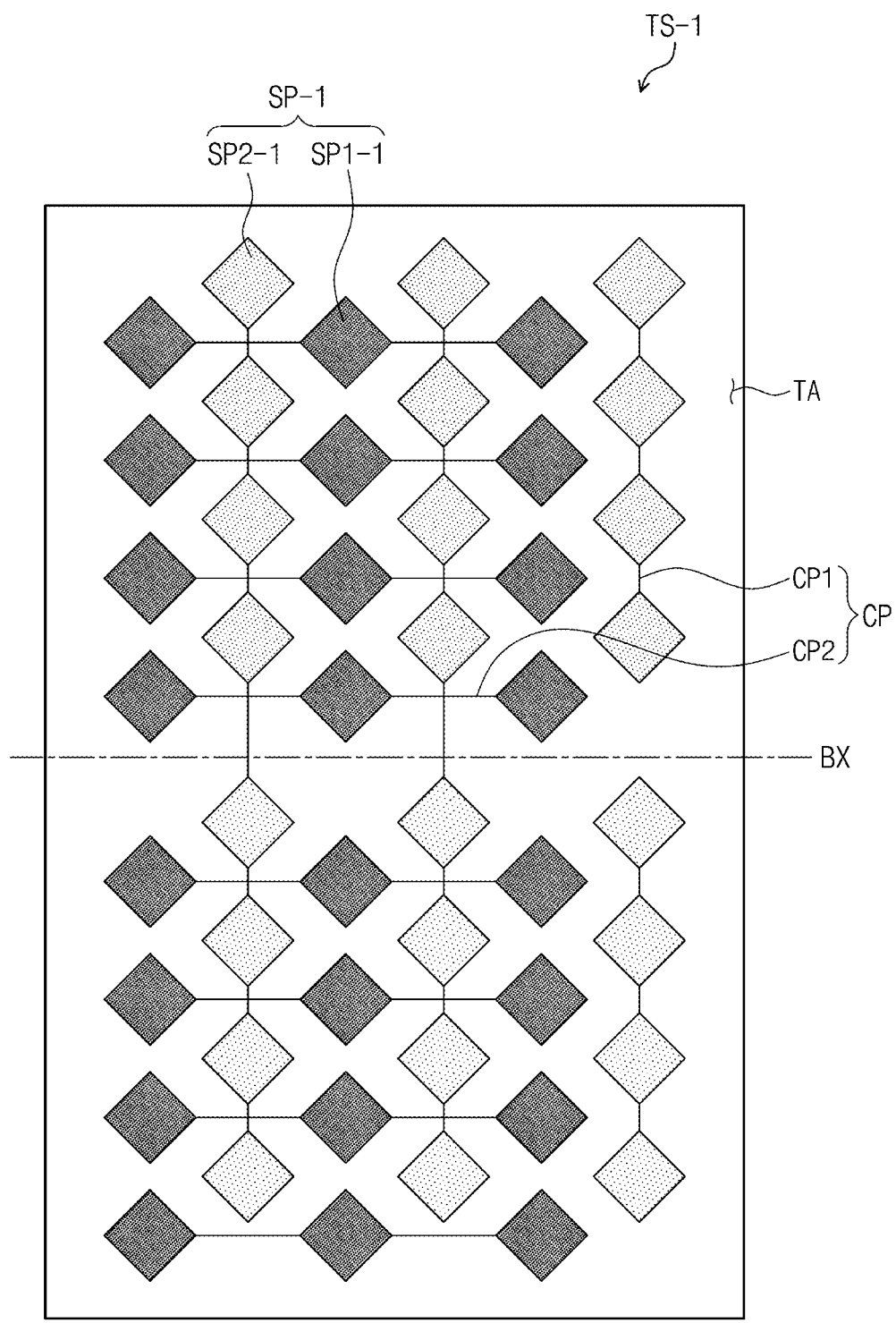
FIG. 12A is a plan view illustrating touch sensors disposed in a touch sensing area.
Figure 12B:
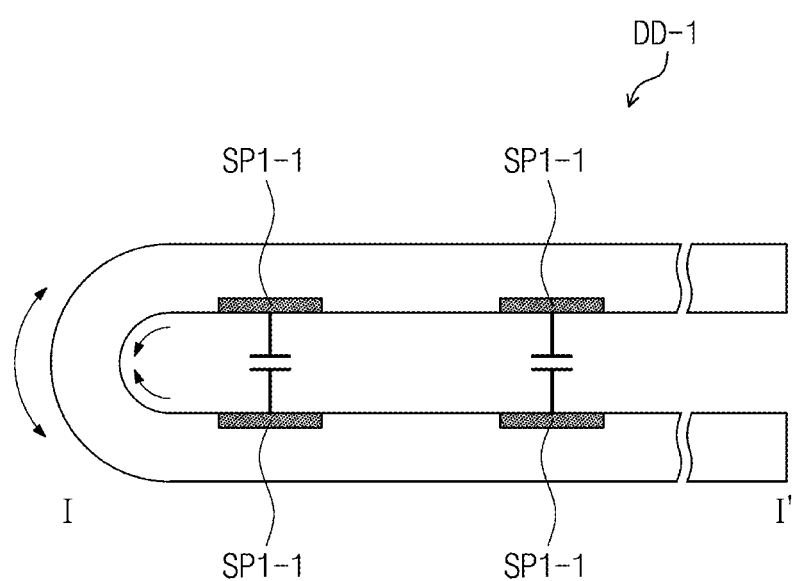
FIG. 12B is a cross-sectional view taken along the line I-I' of FIG. 1B to illustrate a display device according to some exemplary embodiments.

FIG. 12A is a plan view illustrating touch sensors SP disposed in a touch sensing area TA. FIG. 12B is a cross-sectional view taken along the line I-I' of FIG. 1B to illustrate a display device according to an exemplary embodiment.

Referring to FIG. 12A, a sensor unit TS-1 includes touch sensors SP-1 and connection patterns CP, which are disposed in the touch sensing area TA.

The touch sensors SP-1 may include first touch sensors SP1-1 and second touch sensors SP2-1.

Unlike the touch sensors SP illustrated in FIGS. 11A and 11B, the same kind of the touch sensors SP-1 are symmetrical with respect to the bending axis BX in FIG. 12A. For example, one of the first touch sensors SP1-1 and another of the first touch sensors SP1-1 are disposed symmetrically with respect to the bending axis BX. In addition, one of the second touch sensors SP2-1 and another of the second touch sensors SP2-1 are disposed symmetrically with respect to the bending axis BX.

Referring to FIG. 12B, the one of the first touch sensors SP1-1 overlaps with the another of the first touch sensor SP1-1 in the folded-in mode in which the display device DD-1 is folded on the bending axis BX. At this time, the first touch sensors SP1-1 overlapping with each other are capacitively coupled to each other. When external pressure is applied, a capacitance between the first touch sensors SP1-1 capacitively coupled to each other may be varied and the display device DD may sense the variation in the capacitance to measure the external pressure.

In the normal mode, the first touch sensors SP1-1 of a display device DD-1 selectively performs one of a function transmitting electric fields and a function receiving the electric fields. However, in the folded-in mode of the display device DD-1, one of the overlapping two first touch sensors SP1-1 transmits the electric field and the other of the overlapping two first touch sensors SP1-1 receives the electric field.

In the normal mode, the second touch sensors SP2-1 of the display device DD-1 selectively performs one of the function transmitting electric fields and the function receiving the electric fields. However, in the folded-in mode of the display device DD-1, one of overlapping two second touch sensors SP2-1 transmits the electric field and the other of the overlapping two second touch sensors SP2-1 receives the electric field.

The integrated circuit DIC (see FIG. 8) may control the role change of the first and second touch sensors SP1-1 and SP2-1 according to the mode change between the normal mode and the folded-in mode.

Figure 13A:
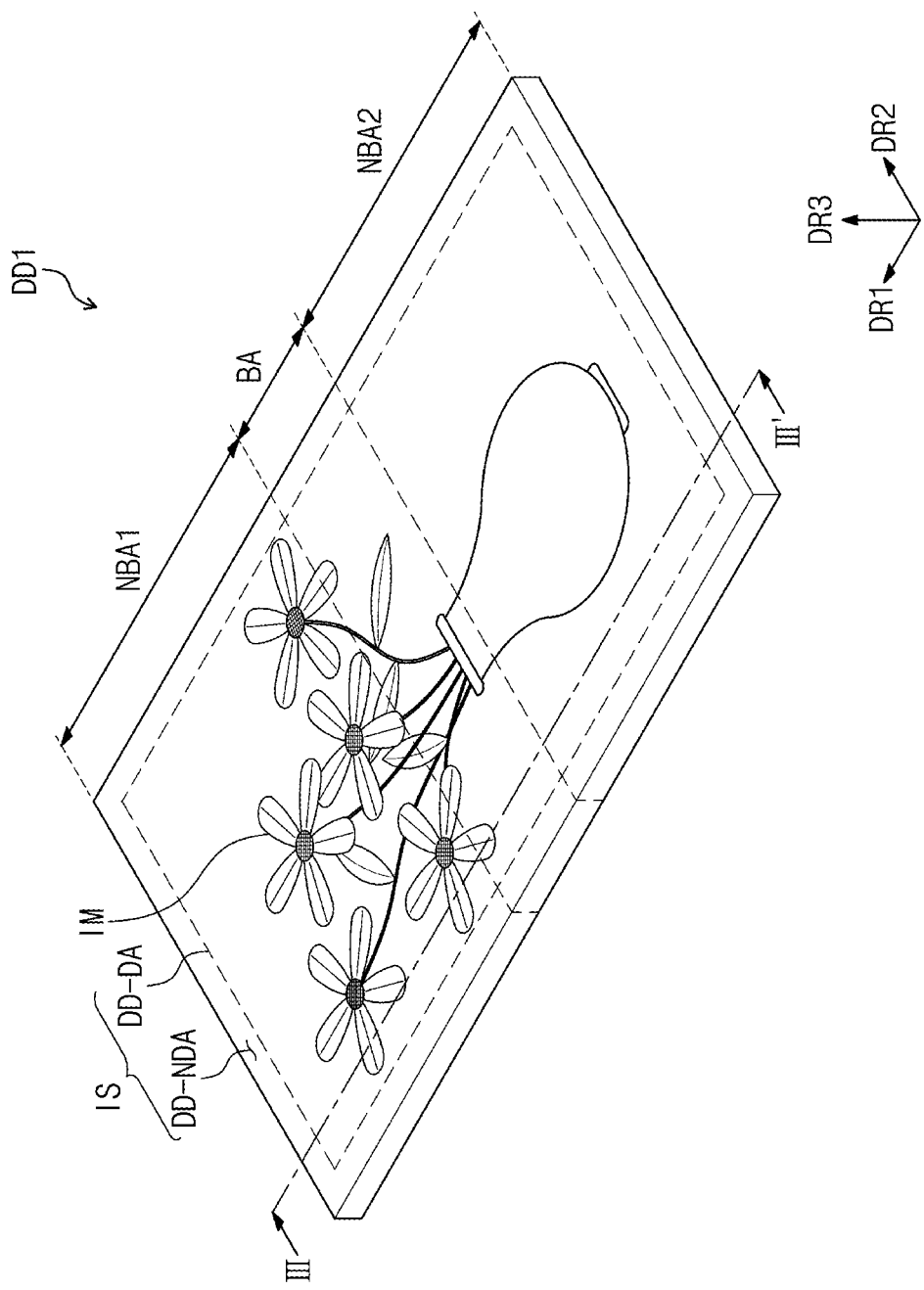
FIG. 13A is a perspective view illustrating a display device in a normal mode, according to some exemplary embodiments.
Figure 13B:
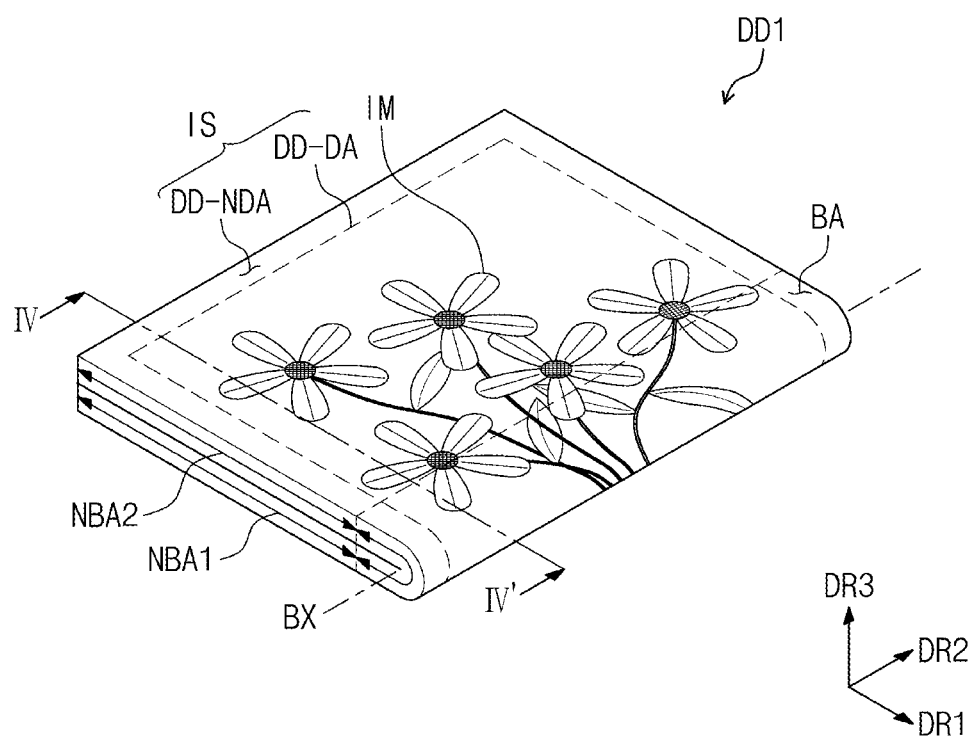
FIG. 13B is a perspective view illustrating the display device of FIG. 13A in a folded-outward mode.

FIG. 13A is a perspective view illustrating a display device DD1 in a normal mode, according to exemplary embodiments. FIG. 13B is a perspective view illustrating the display device DD1 of FIG. 13A in a folded-outward mode.

The display device DD1 in the normal mode in FIG. 13A may be substantially the same as the display device DD in the normal mode in FIG. 1A, and thus the descriptions thereto will be omitted.

As illustrated in FIG. 13B, the display device DD1 may be outer-bent such that a display surface IS of the display device DD1 is exposed outward. In the present specification, a state in which a back surface of a first non-bending area NBA1 faces a back surface of a second non-bending area NBA2 is defined as the folded-outward mode. A state illustrated in FIG. 13A, in which display device DD1 is not in the folded-outward mode, may be defined as the normal mode.

Figure 14A:
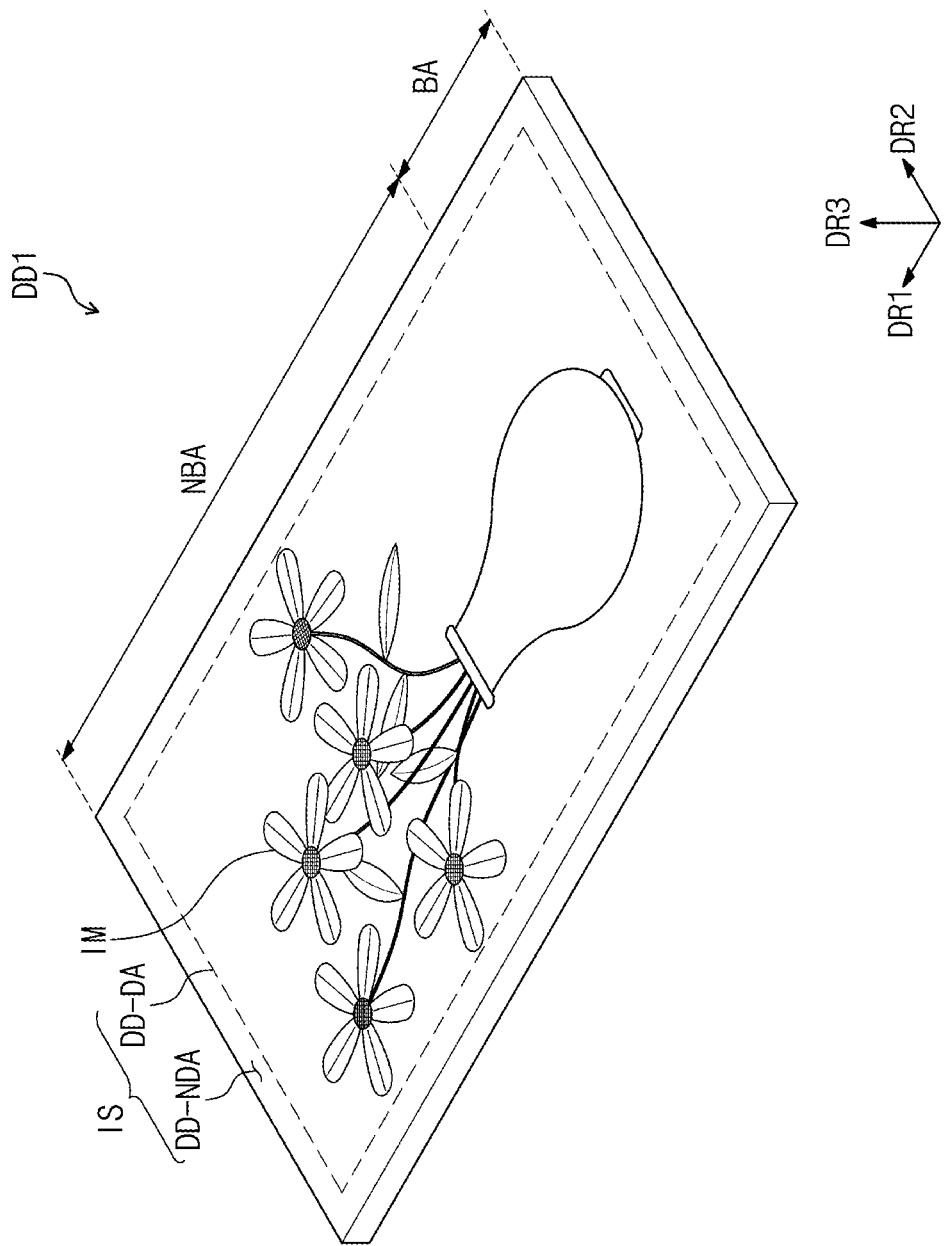
FIG. 14A is a perspective view illustrating a display device in a normal mode, according to some exemplary embodiments.
Figure 14B:
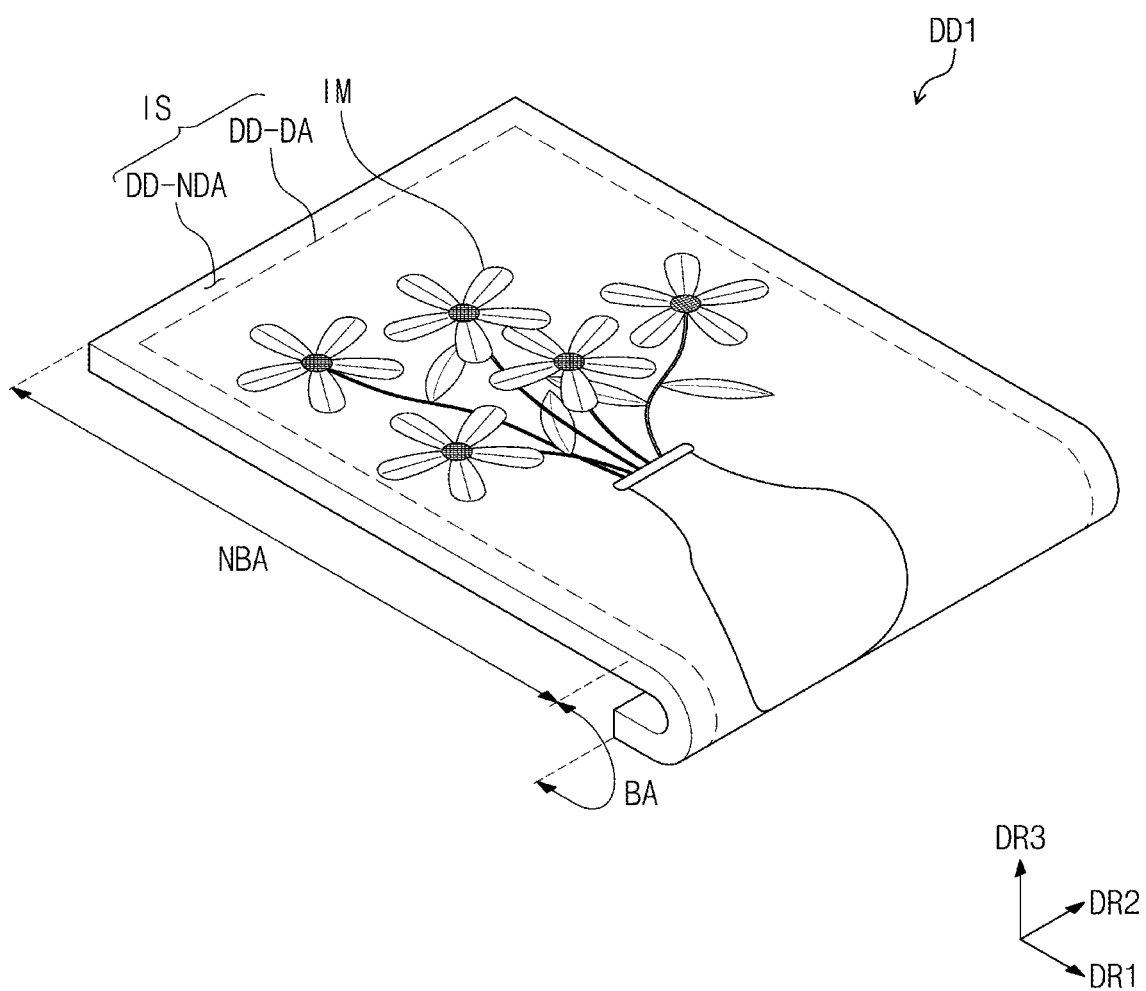
FIG. 14B is a perspective view illustrating the display device of FIG. 14A in a folded-outward mode.

FIG. 14A is a perspective view illustrating a display device DD1 in a normal mode, according to exemplary embodiments. FIG. 14B is a perspective view illustrating the display device DD1 of FIG. 14A in a folded-outward mode. FIGS. 14A and 14B illustrate an example of a display device DD of which a folding portion is different from that of the display device DD1 illustrated in FIGS. 13A and 13B. As such, embodiments of the inventive concepts are not limited to the numbers of the bending area BA and the non-bending area NBA of the display device DD1 and a position of the bending area of the display device DD1.

FIG. 15A is a cross-sectional view taken along a line of FIG. 13A to illustrate a display device according to an exemplary embodiment. FIG. 15B is a cross-sectional view taken along a line IV-IV' of FIG. 13B to illustrate a display device according to an exemplary embodiment.

Referring to FIG. 15A, a force sensor FSS is disposed under the display module DM. The force sensor FSS includes a first force-sensing electrode FS1 and a second force-sensing electrode FS2. The first force-sensing electrode FS1 and the second force-sensing electrode FS2 may be symmetrical with respect to the bending axis BX.

Referring to FIG. 15B, the first force-sensing electrode FS1 overlaps with the second force-sensing electrode FS2 in the folded-outward mode. The first and second force-sensing electrodes FS1 and FS2 overlapping with each other are capacitively coupled to each other. When external pressure is applied, a capacitance between the capacitively coupled first and second force-sensing electrodes FS1 and FS2 may be varied and the display device DD1 may sense the variation in the capacitance to measure the external pressure.

Figure 16A:
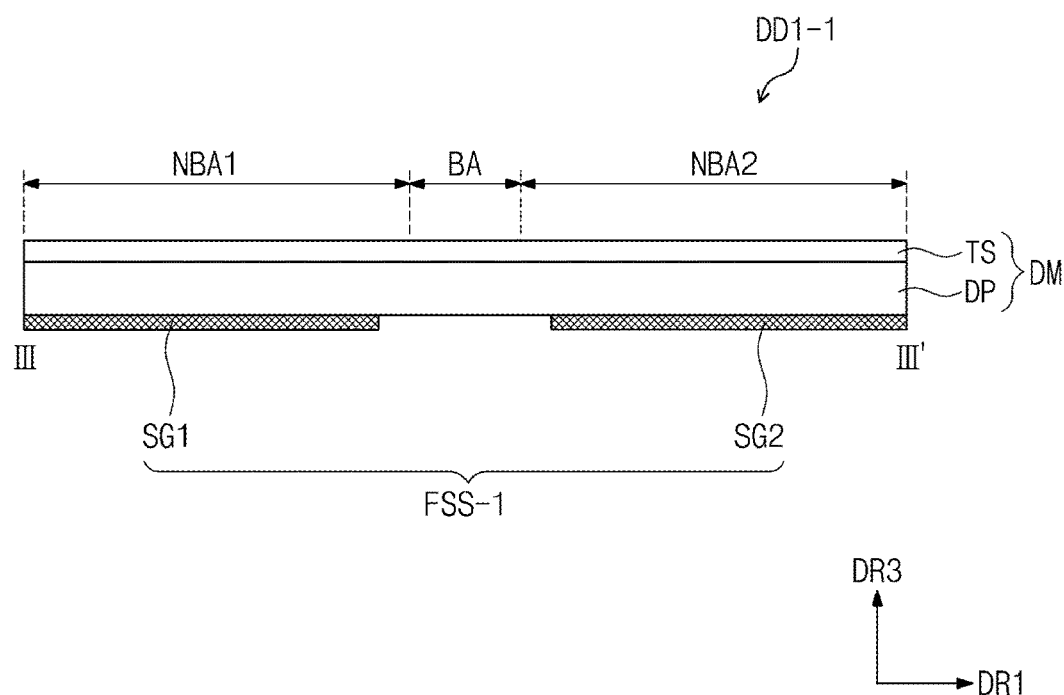
FIG. 16A is a cross-sectional view taken along the line III-III' of FIG. 13A to illustrate a display device according to some exemplary embodiments.
Figure 16B:
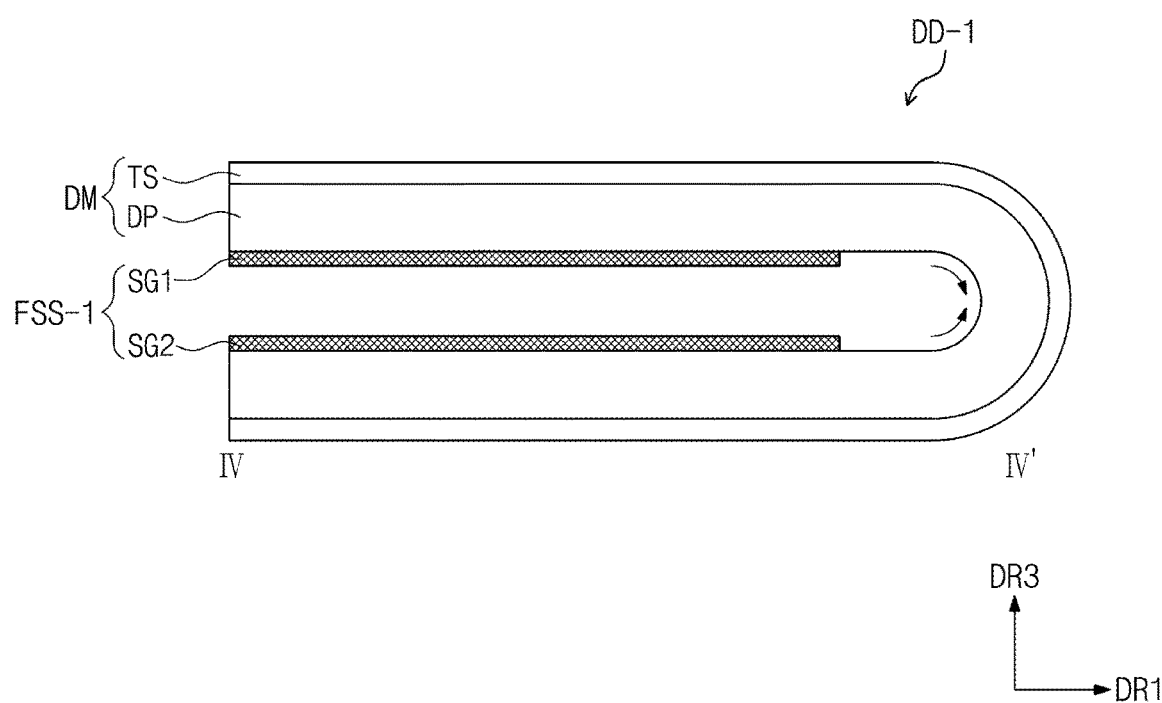
FIG. 16B is a cross-sectional view taken along the line IV-IV' of FIG. 13B to illustrate a display device according to some exemplary embodiments.
Figure 16C:
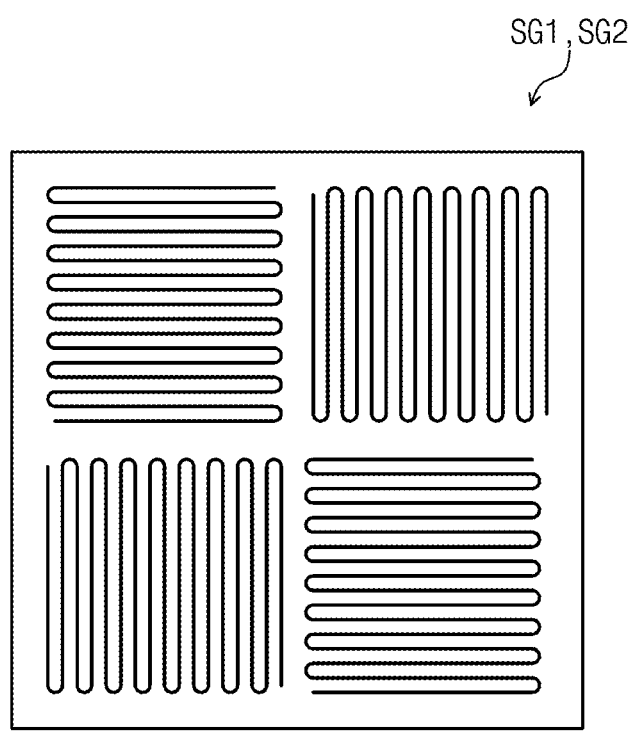
FIG. 16C illustrates strain gauges of FIG. 16A.

FIG. 16A is a cross-sectional view taken along the line III-III' of FIG. 13A to illustrate a display device according to an exemplary embodiment. FIG. 16B is a cross-sectional view taken along the line IV-IV' of FIG. 13B to illustrate a display device according to an exemplary embodiment. FIG. 16C illustrates strain gauges SG1 and SG2 of FIG. 16A.

Referring to FIG. 16A, a force sensor FSS-1 is disposed under the display module DM. The force sensor FSS-1 includes strain gauges SG1 and SG2. The strain gauges SG1 and SG2 may include a first strain gauge SG1 and a second strain gauge SG2. The first strain gauge SG1 may be disposed to overlap with the first non-bending area NBA1, and the second strain gauge SG2 may be disposed to overlap with the second non-bending area NBA2.

The strain gauge is used to measure pressure, torque or stress by using a pressure resistance effect, which means that a resistance value of a resistor formed of a metal or semi-conductor is varied when the resistor is deformed.

Referring to FIG. 16C, a metal pattern of each of the strain gauges SG1 and SG2 may have specific directivity. A direction of the metal pattern of one of the strain gauges SG1 and SG2 may be perpendicular to a direction of the metal pattern of another strain gauge that is adjacent to the one strain gauge. In this manner, the strain gauges SG1 and SG2 may be disposed such that the directions of the metal patterns are perpendicular to each other, and thus the sensitivity of the measured pressure may be improved.

Figure 17:
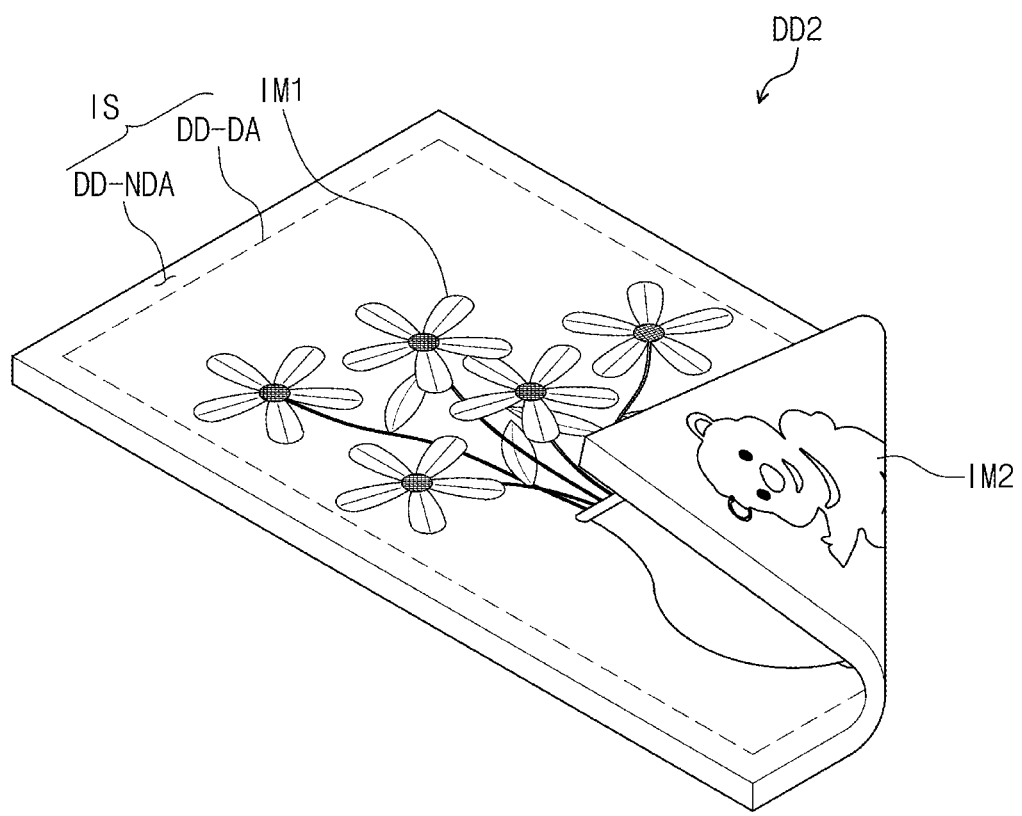
FIG. 17 is a perspective view illustrating a display device according to some exemplary embodiments.

FIG. 17 is a perspective view illustrating a display device DD2 according to exemplary embodiments. The display device DD2 is a both surface light-emitting display device that provides images IM1 and IM2 through its front surface and back surface. The display device DD2 provides a first image IM1 through its front surface. In FIG. 17, a flower vase image is illustrated as an example of the first image IM1. The display device DD2 provides a second image IM2 through its back surface. In FIG. 17, a bear doll image is illustrated as an example of the second image IM2.

Figure 18:
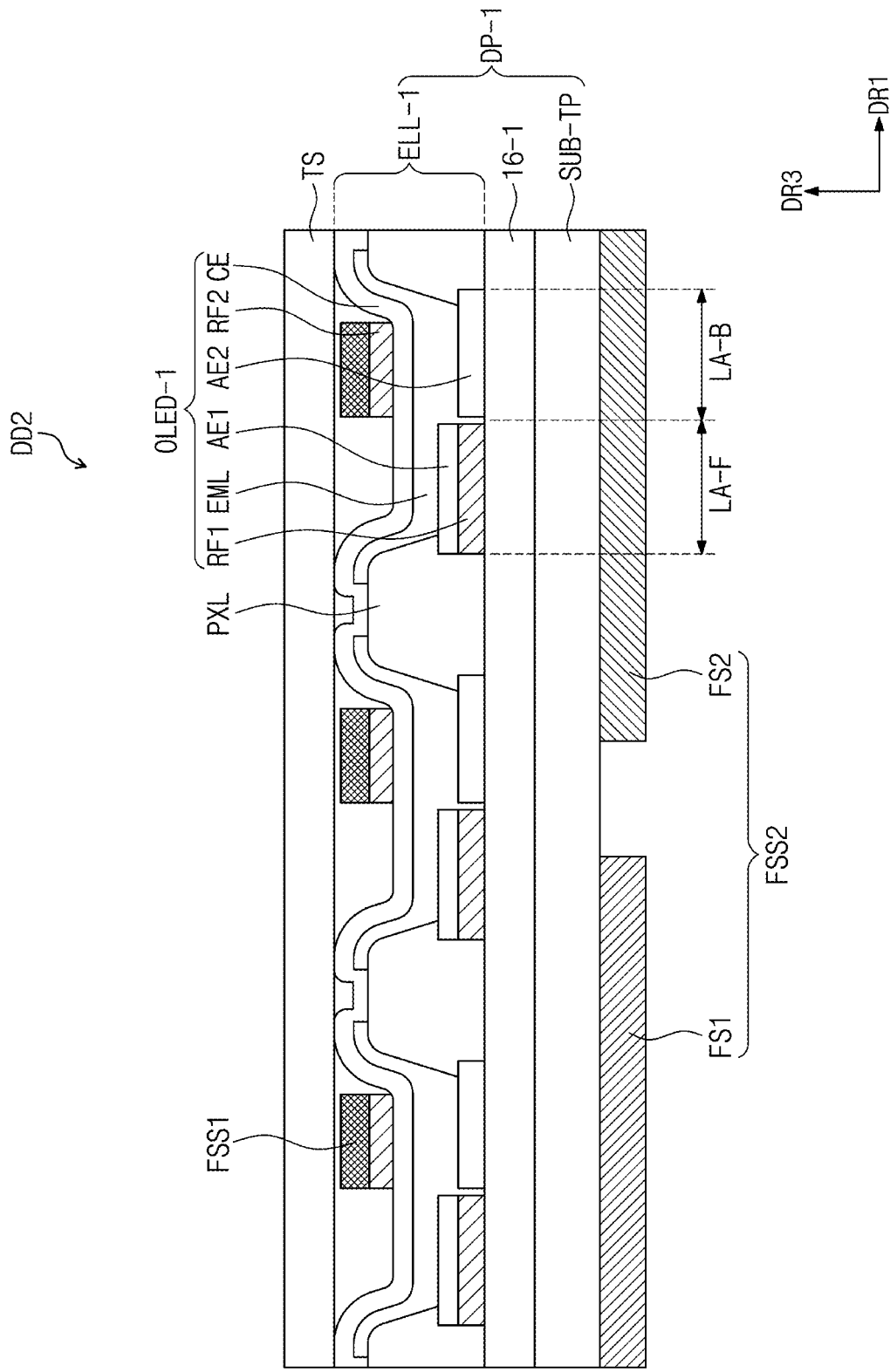
FIG. 18 is a partial cross-sectional view illustrating a display device according to some exemplary embodiments.

FIG. 18 is a partial cross-sectional view illustrating a display device DD2 according to exemplary embodiments. The display device DD2 includes a display panel DP-1, a sensor unit TS, a first force sensor FSS1, and a second force sensor FSS2. The display panel DP-1 includes a transparent base layer SUB-TP, an insulating layer 16-1, and a light-emitting device layer ELL-1.

The transparent base layer SUB-TP may transmit at least a portion of incident light. For example, the transparent base layer SUB-TP may include glass.

The insulating layer 16-1 is disposed on the transparent base layer SUB-TP. A function and a material of the insulating layer 16-1 may be substantially the same as those of the third insulating layer 16 of FIGS. 6 and 7, and thus the descriptions thereto will be omitted.

The light-emitting device layer ELL-1 is disposed on the insulating layer 16-1. The light-emitting device layer ELL-1 includes a light-emitting device OLED-1. The light-emitting device OLED-1 may include a front surface light emitting area LA-F and a back surface light emitting area LA-B.

The light-emitting device OLED-1 includes a first reflection layer RF1, a first anode AE1, a second anode AE2, a light-emitting layer EML, a cathode CE, and a second reflection layer RF2.

The first reflection layer RF1 is disposed on the insulating layer 16-1 and overlaps with the front surface light emitting area LA-F. The first reflection layer RF1 may reflect incident light.

The first anode AE1 is disposed on the first reflection layer RF1 and overlaps with the front surface light emitting area LA-F. The second anode AE2 is disposed on the insulating layer 16-1 and overlaps with the back surface light emitting area LA-B.

The light-emitting layer EML is disposed on the first anode AE1 and the second anode AE2 and overlaps with the front surface light emitting area LA-F and the back surface light emitting area LA-B.

The cathode CE is disposed on the light-emitting layer EML and overlaps with the front surface light emitting area LA-F and the back surface light emitting area LA-B.

The second reflection layer RF2 is disposed on the cathode CE and overlaps with the back surface light emitting area LA-B. The second reflection layer RF2 may reflect incident light.

Light generated in the light-emitting layer EML is reflected by the first reflection layer RF1 so as to be emitted to the front surface. Light generated in the light-emitting layer EML is reflected by the second reflection layer RF2 so as to be emitted to the back surface. Thus, the light-emitting device OLED-1 may emit the light to the front surface and the back surface.

The first force sensor FSS1 is disposed on the second reflection layer RF2 and overlaps with the back surface light emitting area LA-B. The first force sensor FSS1 may sense pressure applied to the display device DD2. The first force sensor FSS1 may include a strain gauge.

The sensor unit TS may be disposed on the first force sensor FSS1.

The second force sensor FSS2 is disposed under the display panel DP-1. When the display device DD2 is folded, the second force sensor FSS2 may sense pressure applied to the display device DD2.

The second force sensor FSS2 includes a first force-sensing electrode FS1 and a second force-sensing electrode FS2. The first and second force-sensing electrodes FS1 and FS2 may be substantially the same as described with reference to FIG. 15A, and thus the descriptions thereto will be omitted.

Figure 19:
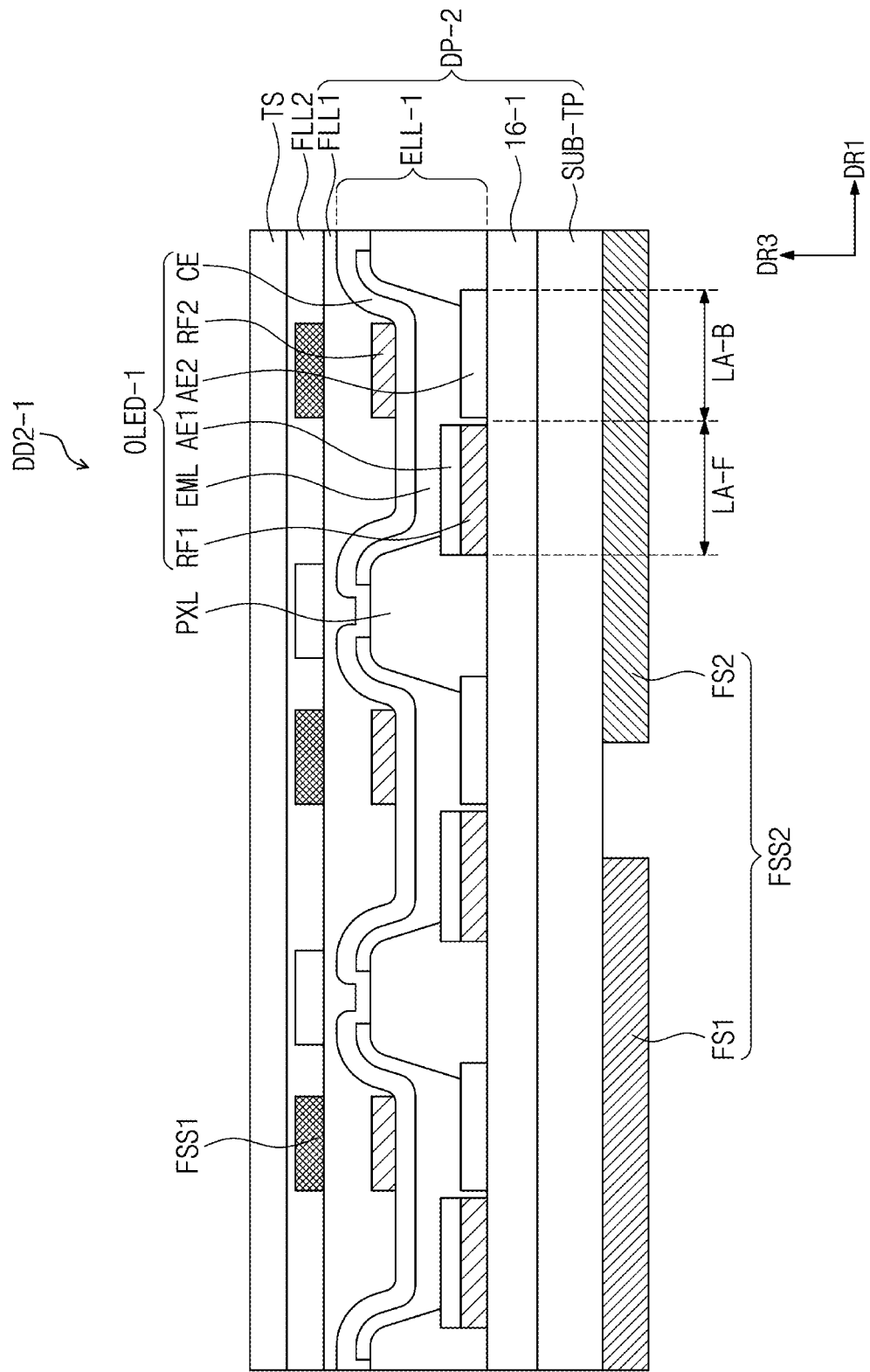
FIG. 19 is a partial cross-sectional view illustrating a display device according to some exemplary embodiments.

FIG. 19 is a partial cross-sectional view illustrating a display device DD2-1 according to an exemplary embodiment.

The display device DD2-1 includes a display panel DP-2, a sensor unit TS, a first force sensor FSS1, and a second force sensor FSS2. The display panel DP-2 includes the transparent base layer SUB-TP, the insulating layer 16-1, the light-emitting device layer ELL-1, and a planarization layer FLL1.

The planarization layer FLL1 covers the light-emitting device layer ELL-1 and provides a flat or planarized surface. The planarization layer FLL1 may include an organic material. In some embodiments, the planarization layer FLL1 may act as a sealing material sealing the light-emitting device layer ELL-1.

The first force sensor FSS1 may be disposed on the planarization layer FLL1. The first force sensor FSS1 may be covered with an additional planarization layer FLL2.

Other elements or components of the display device DD2-1 may be substantially the same as described with reference to FIG. 18, and thus the descriptions thereto will be omitted.

Figure 20:
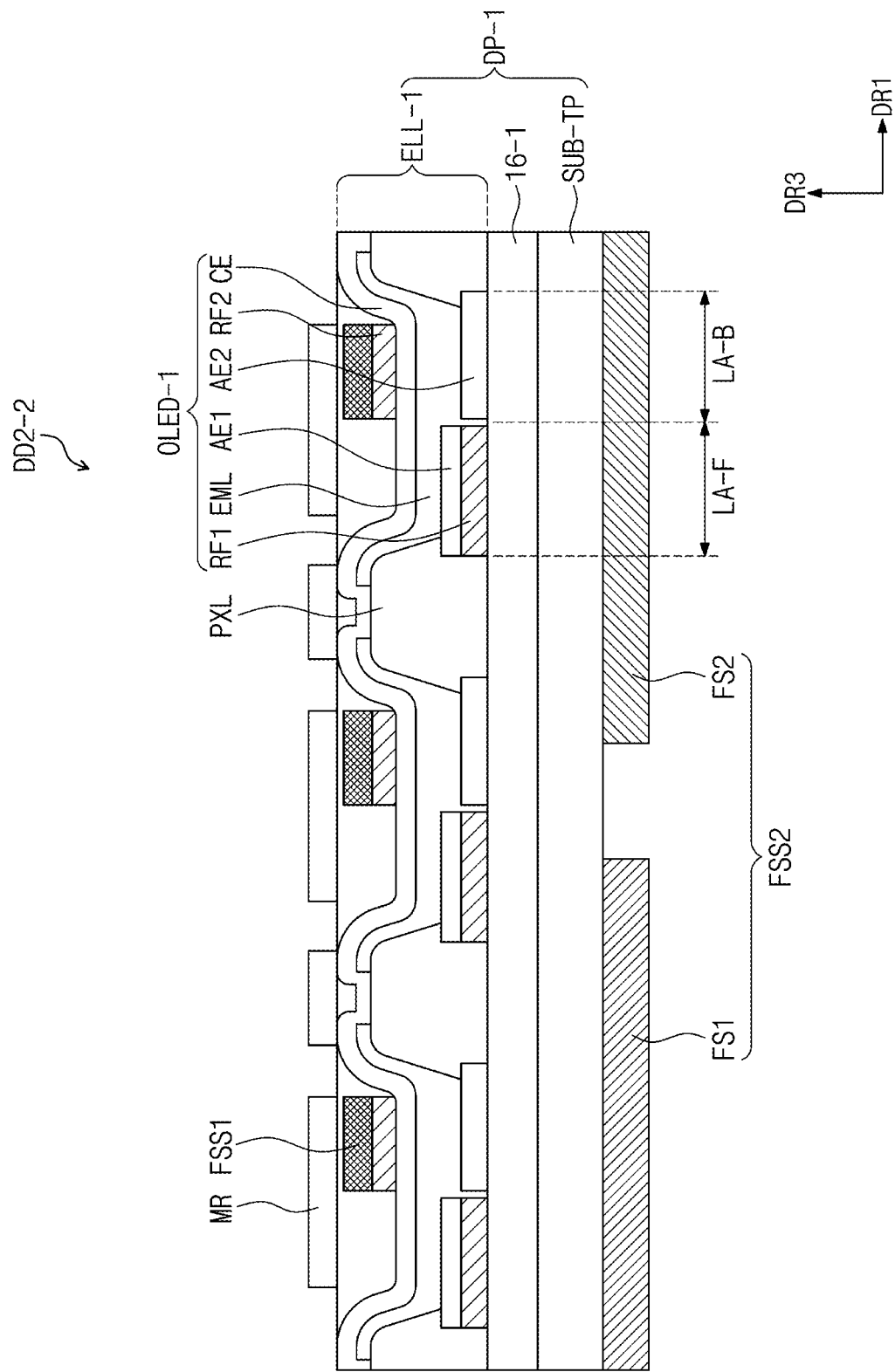
FIG. 20 is a partial cross-sectional view illustrating a display device according to some exemplary embodiments.

FIG. 20 is a partial cross-sectional view illustrating a display device DD2-2 according to exemplary embodiments.

The display device DD2-2 includes the display panel DP-1, a reflection member MR, the first force sensor FSS1, and the second force sensor FSS2.

The reflection member MR is disposed on the first force sensor FSS1 and overlaps in plan view with the front surface light emitting area LA-F and the back surface light emitting area LA-B. The reflection member MR may reflect light to provide a mirror function to a user.

The reflection member MR may be capacitively coupled to the first force sensor FSS1 to sense a touch of a user. For example, the reflection member MR and the first force sensor FSS1 may sense a touch by a self-cap method.

Figure 21:
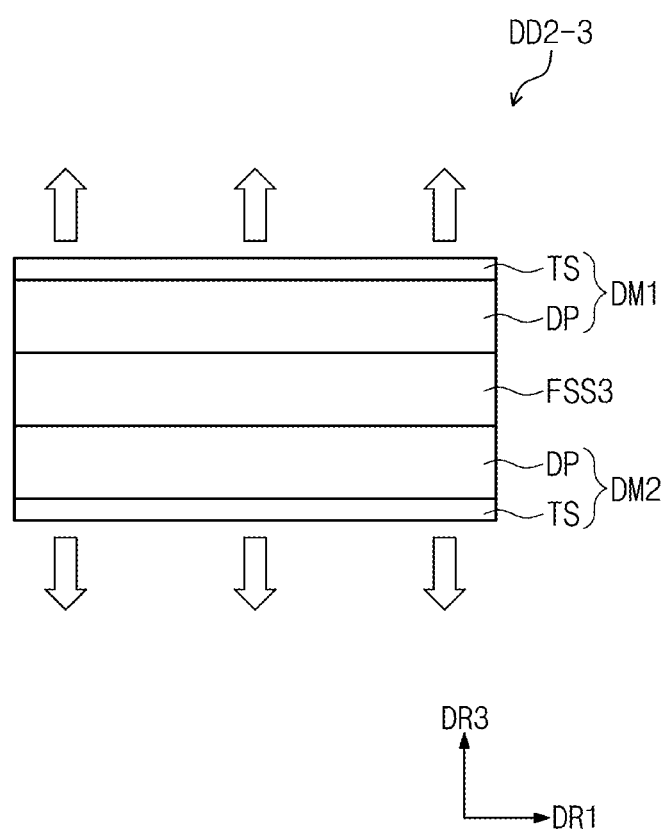
FIG. 21 is a cross-sectional view illustrating a display device according to some exemplary embodiments.

FIG. 21 is a cross-sectional view illustrating a display device DD2-3 according to exemplary embodiments. The display device DD2-3 includes a first display module DM1, a second display module DM2, and a force sensor FSS3. The first and second display modules DM1 and DM2 may be substantially the same as described with reference to FIGS. 3 to 7, and thus the descriptions thereto will be omitted.

The force sensor FSS3 is disposed between the first display module DM1 and the second display module DM2. The force sensor FSS3 may sense pressure applied to the display device DD2-3.

FIGS. 22, 23, 24, 25, and 26 are cross-sectional views illustrating force sensors FSS3, FSS3-1, FSS3-2, FSS3-3, and FSS3-4 according to exemplary embodiments.

Figure 22:
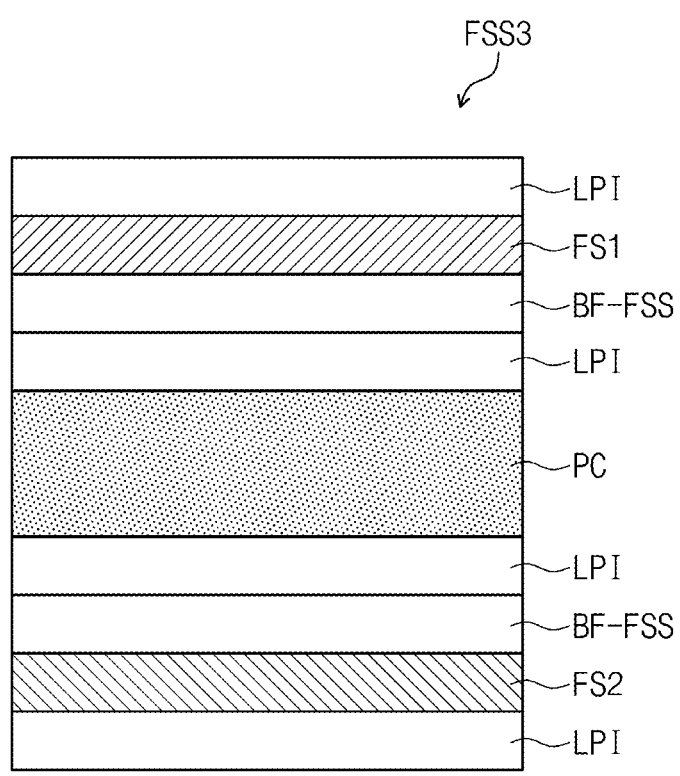
FIGS. 22, 23, 24, 25, and 26 are cross-sectional views illustrating force sensors according to some exemplary embodiments.

Referring to FIG. 22, the force sensor FSS3 includes an insulating layer LPI, a buffer layer BF-FSS, a pressure cushion PC, a first force-sensing electrode FS1, and a second force-sensing electrode FS2. In some embodiments, the force sensor FSS3 may include the insulating layer LPI, the second force-sensing electrode FS2, the buffer layer BF-FSS, the insulating layer LPI, the pressure cushion PC, the insulating layer LPI, the buffer layer BF-FSS, the first force-sensing electrode FS1 and the insulating layer LPI which may be stacked in the order listed. However, exemplary embodiments are not limited to the stack order of the force sensor FSS3. In certain embodiments, the insulating layer LPI, the buffer layer BF-FSS, the pressure cushion PC, the first force-sensing electrode FS1 and the second force-sensing electrode FS2 may be stacked in another stack order.

The first force-sensing electrode FS1 is capacitively coupled to the second force-sensing electrode FS2. In some embodiments, the first force-sensing electrode FS1 may transmit an electric field and the second force-sensing electrode FS2 may receive the electric field.

In other exemplary embodiments, a function of each of the first and second force-sensing electrodes FS1 and FS2 of the force sensor FSS3-3 may be changed according to a driving mode. For example, in a first driving mode, the first force-sensing electrode FS1 may transmit the electric field and the second force-sensing electrode FS2 may receive the electric field. In a second driving mode, the second force-sensing electrode FS2 may transmit the electric field and the first force-sensing electrode FS1 may receive the electric field.

Figure 23:
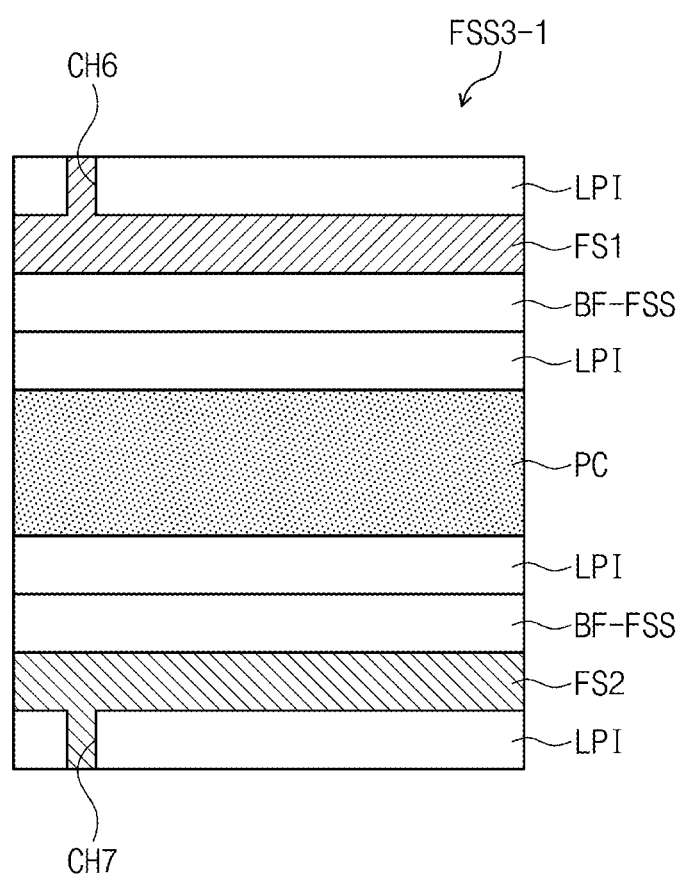

Referring to FIG. 23, the first force-sensing electrode FS1 of the force sensor FSS3-1 may be electrically connected to the sensor unit TS of the first display module DM1 through a sixth through-hole CH6. The second force-sensing electrode FS2 of the force sensor FSS3-1 may be electrically connected to the sensor unit TS of the second display module DM2 through a seventh through-hole CH7. In this example, the force sensor FSS3-1 may be supplied with an electrical signal from the sensor unit TS and may thus be driven and controlled.

Figure 24:
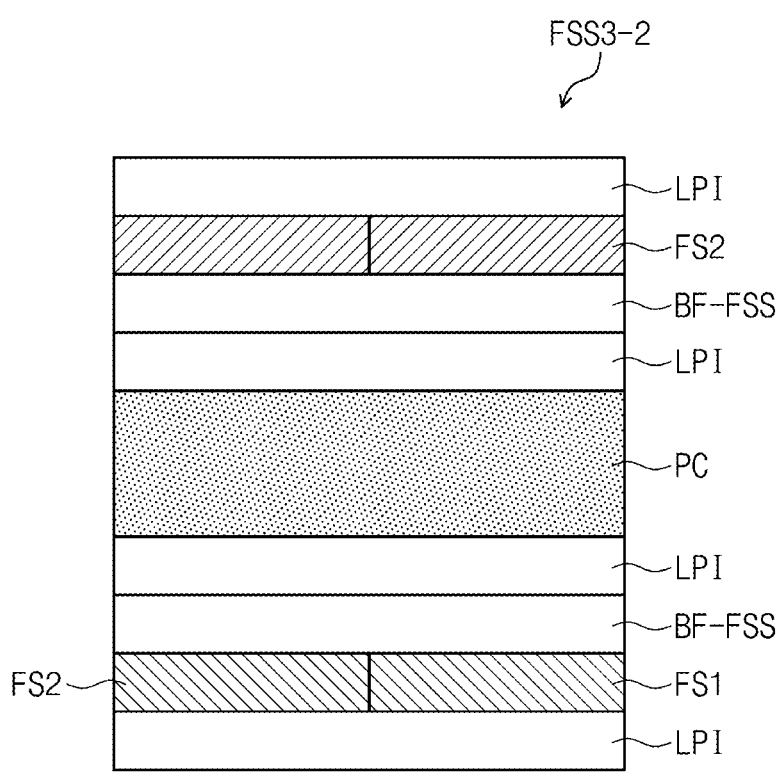

Referring to FIG. 24, first and second force-sensing electrodes FS1 and FS2 of the force sensor FSS3-2 may be alternately arranged on the same layer in a lateral direction.

Figure 25:
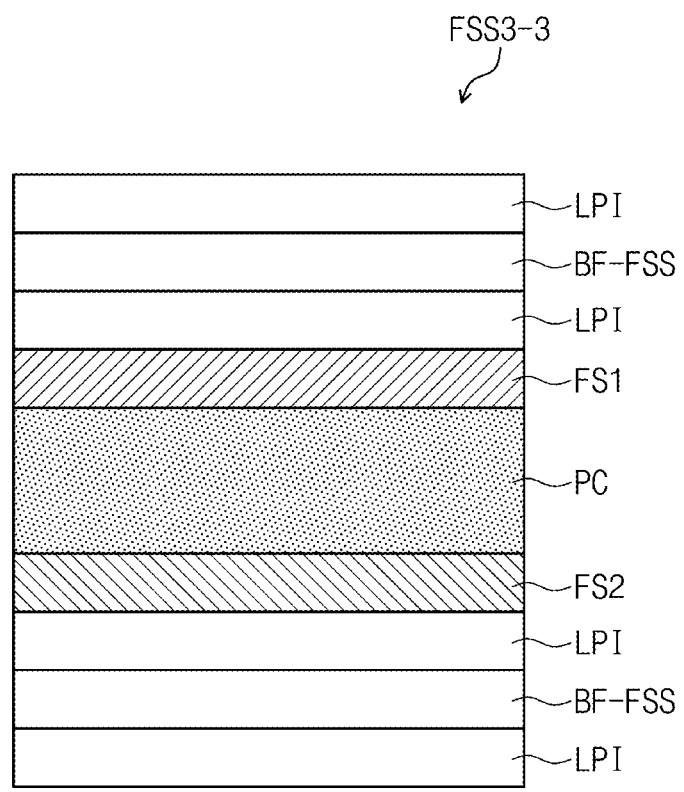

Referring to FIG. 25, the force sensor FSS3-3 may include the insulating layer LPI, the buffer layer BF-FSS, the insulating layer LPI, the second force-sensing electrode FS2, the pressure cushion PC, the first force-sensing electrode FS1, the insulating layer LPI, the buffer layer BF-FSS and the insulating layer LPI which may be stacked in the order listed.

Figure 26:
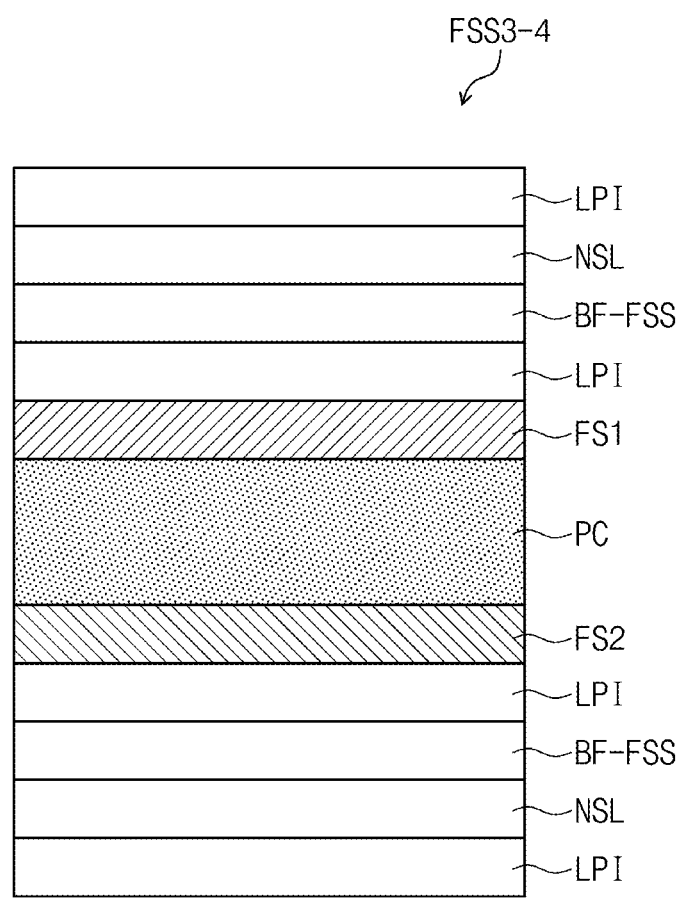

Referring to FIG. 26, the force sensor FSS3-4 may further include a noise-shielding layer NSL. The noise-shielding layer NSL may be disposed between the insulating layer LPI and the buffer layer BF-FSS. However, exemplary embodiments are not limited to the position of the noise-shielding layer NSL.

The noise-shielding layer NSL may shield noise occurring at the transistors of the display panels DP1 and DP2, and thus the force sensor FSS3-4 may effectively sense the pressure.

Figure 27:
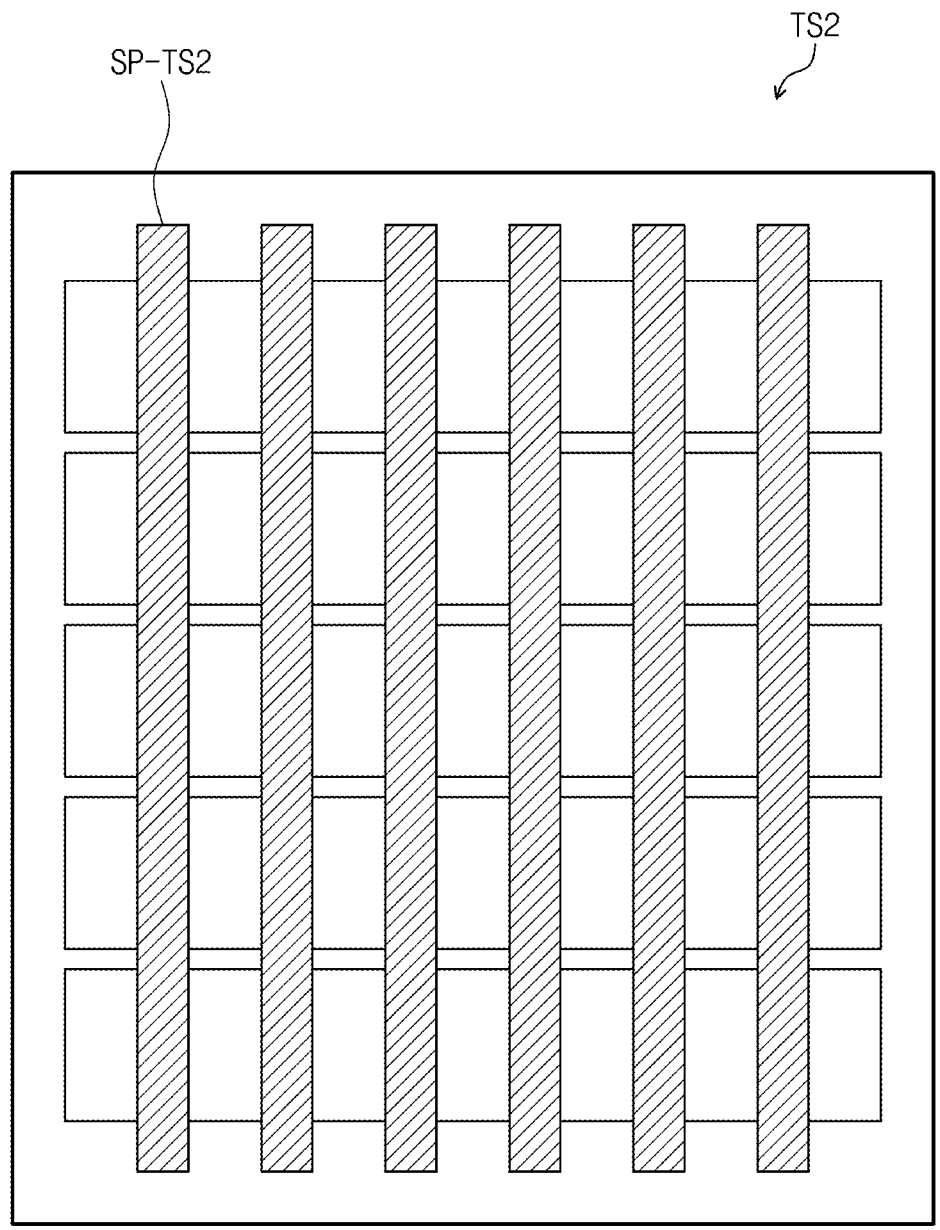
FIGS. 27, 28, and 29 illustrate sensor units according to some exemplary embodiments.
Figure 28:
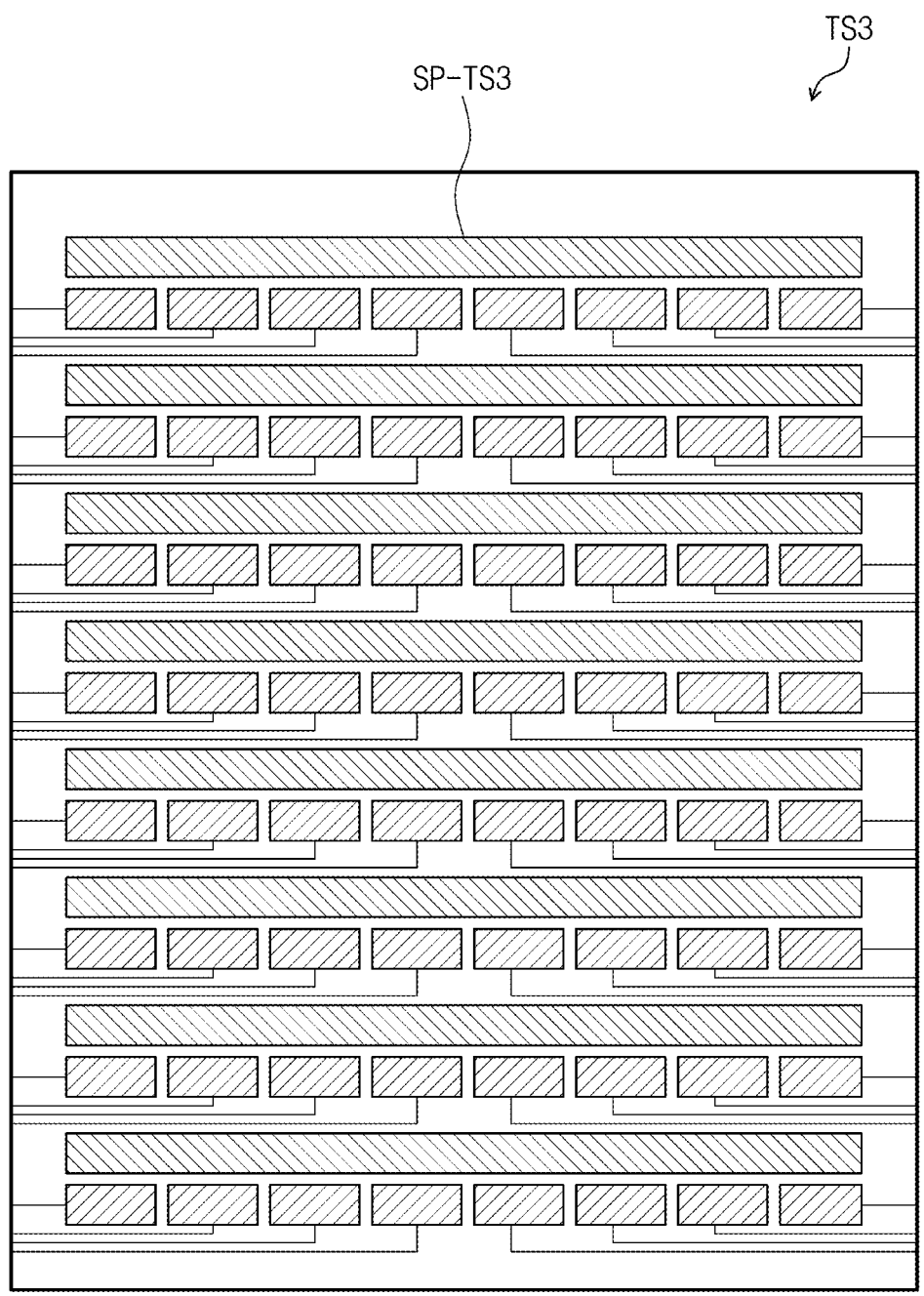
Figure 29:
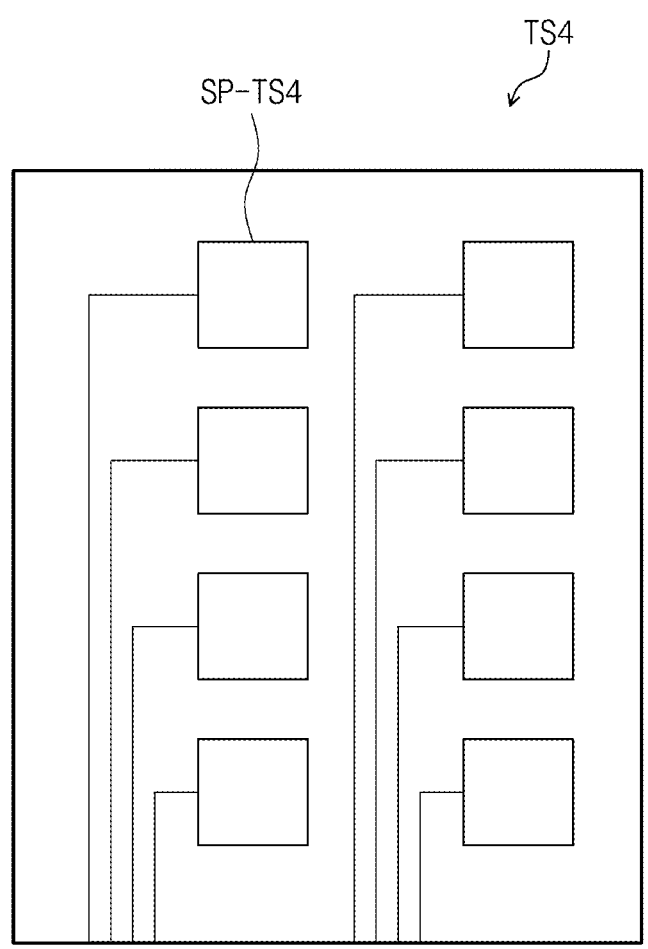

FIGS. 27, 28, and 29 illustrate sensor units TS2, TS3, and TS4 according to an exemplary embodiment.

Referring to FIG. 27, a touch sensor SP-TS2 of the sensor unit TS2 according to an exemplary embodiment may have a stripe pattern shape, unlike the touch sensor of the sensor unit TS described above.

Referring to FIGS. 28 and 29, each of touch sensors SP-TS3 and SP-TS4 of the sensor units TS3 and TS4 may have a shape including a plurality of quadrilateral patterns, unlike the touch sensor of the sensor unit TS described above.

In the folded-in mode, the display device according to exemplary embodiments may sense applied pressure through the capacitive type sensor unit for sensing a touch of a user.

The display device according to exemplary embodiments may sense applied pressure through the force sensor in the folded-outward mode.

The display device according to exemplary embodiments may be a both surface display device providing images in both directions and may sense applied pressure through the force sensor.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
    a display panel comprising a display area and a non-display area, the display area having a first area, a second area, and a third area disposed between the first area and the second area in an unfolded state, wherein the third area has a curvature in a folded state, with respect to a bending axis;
    a sensing unit including touch signal lines and touch sensors disposed on the display panel; and
    an anti-reflection layer including a color filter on the display panel,
    wherein:
    the display panel comprises:
        a base layer overlapped with the display area and the non-display area;
        a circuit layer including a first transistor and a second transistor disposed on the base layer;
        light emitting elements disposed on the circuit layer, each of the light emitting elements comprising a first electrode, a second electrode disposed on the first electrode, and a light emitting layer disposed between the first electrode and the second electrode;
        a pixel defining layer on the circuit layer, the pixel defining layer partially exposing the first electrode, wherein a light emitting area is defined in the display panel corresponding to a portion of the first electrode exposed from the pixel defining layer;
        a thin film sealing layer disposed on the second electrode; and
    a protective film under the base layer;
    the sensing unit is disposed on the thin film sealing layer;
    each of touch sensors has a substantially mesh shape and comprises titanium and aluminum;
    each of touch signal lines comprises titanium and aluminum;
    each of the touch sensors is not overlapped with the light emitting area in a plan view;
    the thin film sealing layer comprises an organic layer and an inorganic layer;
    the first transistor includes a metal oxide semiconductor;
    the second transistor includes a poly-silicon semiconductor;
    each of the plurality of touch sensors comprises a first sensor extended in a first direction crossing the bending axis to be formed from the first area through the third area to the second area and a second sensor extended in a second direction parallel to the bending axis; and
    the first sensor and the second sensor face each other in the folded state.

2. The display device of claim 1, further comprising:
    a first adhesive member on the sensing unit; and
    a window on the first adhesive member.

3. The display device of claim 1, wherein the display panel comprises a capping layer disposed between the second electrode and the thin film sealing layer.

4. The display device of claim 1, wherein;
    the first sensor and the second sensor are disposed symmetrically with respect to the bending axis in the folded state.

5. The display device of claim 1, wherein the second electrode is in common with the light emitting elements.

6. The display device of claim 1, further comprising a frame structure disposed under the display panel,
    wherein the frame structure includes a joint structure or hinge structure.

7. A display device comprising:
    a display panel comprising a display area and a non-display area, the display area having a first area, a second area, and a third area disposed between the first area and the second area in an unfolded state, wherein the third area has a curvature in a folded state, with respect to a bending axis;
a sensing unit including touch signal lines and touch sensors disposed on the display panel;
an anti-reflection layer on the display panel;
a first adhesive member on the sensing unit; and
a window on the first adhesive member,
wherein:
the display panel comprises:
 a base layer overlapped with the display area and the non-display area;
 a circuit layer including a first transistor and a second transistor disposed on the base layer;
 light emitting elements disposed on the circuit layer, each of the light emitting elements comprising a first electrode, a second electrode disposed on the first electrode, and a light emitting layer disposed between the first electrode and the second electrode;
 a pixel defining layer on the circuit layer, the pixel defining layer partially exposing the first electrode, wherein a light emitting area is defined in the display panel corresponding to a portion of the first electrode exposed from the pixel defining layer;
 a capping layer disposed on the second electrode,
 a thin film sealing layer disposed on the capping layer; and
 a protective film under the base layer;
the sensing unit is disposed on the thin film sealing layer;
each of touch sensors has a substantially mesh shape and comprises titanium and aluminum;
each of touch signal lines comprises titanium and aluminum;
each of the touch sensors is not overlapped with the light emitting area in a plan view;
the thin film sealing layer comprises an organic layer and an inorganic layer;
each of the plurality of touch sensors comprises a first sensor extended in a first direction crossing the bending axis to be formed from the first area through the third area to the second area and a second sensor extended in a second direction parallel to the bending axis; and
the first sensor and the second sensor face each other in the folded state.

8. The display device of claim 7, wherein each of the plurality of touch sensors comprises a first sensor and a second sensor,
 the first sensor and the second sensor are disposed symmetrically with respect to the bending axis in the folded state.

9. The display device of claim 7, wherein the second electrode is in common with the light emitting elements.

10. The display device of claim 7, further comprising a frame structure disposed under the display panel,
 wherein the frame structure includes a joint structure or hinge structure.

11. The display device of claim 7, wherein the first transistor includes a metal oxide semiconductor, and
 wherein the second transistor includes a poly-silicon semiconductor.

12. A display device comprising:
a display panel comprising a display area and a non-display area, the display area having a first area, a second area, and a third area disposed between the first area and the second area in an unfolded state, wherein the third area has a curvature in a folded state, with respect to a bending axis;
a sensing unit including touch signal lines and touch sensors disposed on the display panel;
an anti-reflection layer on the display panel;
a first adhesive member on the sensing unit;
a window on the first adhesive member; and
a frame structure disposed under the display panel,
wherein:
the display panel comprises:
 a base layer overlapped with the display area and the non-display area;
 a circuit layer including a first transistor and a second transistor disposed on the base layer;
 light emitting elements disposed on the circuit layer, each of the light emitting elements comprising a first electrode, a second electrode disposed on the first electrode, and a light emitting layer disposed between the first electrode and the second electrode;
 a pixel defining layer on the circuit layer, the pixel defining layer partially exposing the first electrode, wherein a light emitting area is defined in the display panel corresponding to a portion of the first electrode exposed from the pixel defining layer;
 a capping layer on the second electrode;
 a thin film sealing layer disposed on the capping layer; and
 a protective film under the base layer;
the sensing unit is disposed on the thin film sealing layer;
each of touch sensors has a substantially mesh shape and comprises titanium and aluminum;
each of touch signal lines comprises titanium and aluminum;
each of the touch sensors is not overlapped with the light emitting area in a plan view;
the thin film sealing layer comprises an organic layer and an inorganic layer;
the second electrode is in common with the light emitting elements;
the frame structure includes a joint structure or hinge structure;
each of the plurality of touch sensors comprises a first sensor extended in a first direction crossing the bending axis to be formed from the first area through the third area to the second area and a second sensor extended in a second direction parallel to the bending axis; and
the first sensor and the second sensor face each other in the folded state.

13. The display device of claim 12, wherein:
each of the plurality of touch sensors comprises a first sensor and a second sensor; and
the first sensor and the second sensor are disposed symmetrically with respect to the bending axis in the folded state.

14. The display device of claim 12, wherein:
the first transistor includes a metal oxide semiconductor; and
the second transistor includes a poly-silicon semiconductor.

* * * * *